United States Patent
Hashimoto

(10) Patent No.: US 6,489,687 B1
(45) Date of Patent: Dec. 3, 2002

(54) SEMICONDUCTOR DEVICE AND METHOD OF MANUFACTURING THE SAME, MANUFACTURING DEVICE, CIRCUIT BOARD, AND ELECTRONIC EQUIPMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/856,923

(22) PCT Filed: Sep. 29, 2000

(86) PCT No.: PCT/JP00/06769

§ 371 (c)(1),
(2), (4) Date: May 30, 2001

(87) PCT Pub. No.: WO01/26155

PCT Pub. Date: Apr. 12, 2001

(30) Foreign Application Priority Data

Oct. 1, 1999 (JP) .......................... 11-281423

(51) Int. Cl.[7] .......................... H01L 29/40; H01L 23/48
(52) U.S. Cl. .......................... 257/777; 257/685; 257/686; 257/723
(58) Field of Search .......................... 257/737, 738, 257/777, 778, 787, 698, 774, 686, 685; 438/613; 228/180–22

(56) References Cited

U.S. PATENT DOCUMENTS 5,239,198 A * 8/1993 Lin et al. .................... 257/693
5,815,372 A * 9/1998 Gallas .......................... 361/760
6,080,931 A * 6/2000 Park et al. ................... 174/52.4
6,104,088 A * 8/2000 Hatano et al. ............... 257/698

FOREIGN PATENT DOCUMENTS

| JP | 50-136357 | 11/1975 | |
|---|---|---|---|
| JP | A 58-16557 | 1/1983 | |
| JP | 4-277699 | * 10/1992 | .......... 29/281.1 |
| JP | A 6-302645 | 10/1994 | |
| JP | A 9-270435 | 10/1997 | |
| JP | A 11-111758 | 4/1999 | |
| JP | A 11-312712 | 11/1999 | |
| JP | A 11-312780 | 11/1999 | |
| JP | A 2000-3922 | 1/2000 | |
| JP | A 2000-133766 | 5/2000 | |
| JP | A 2000-294722 | 10/2000 | |

* cited by examiner

Primary Examiner—Jasmine J B Clark
(74) Attorney, Agent, or Firm—Oliff & Berridge, PLC

(57) ABSTRACT

A semiconductor device includes at least one substrate (50) including a plurality of holes (56) and an interconnecting pattern (52) provided to one surface, part of the interconnecting pattern (52) being formed over the holes (56); at least one first semiconductor chip (10) including a plurality of electrodes (12) and provided to another surface of the substrate (50), at least one second semiconductor chip (20) including a plurality of electrodes (12) and provided to the one surface of the substrate (50); and a conductive member for electrically connecting the electrodes (12) of the first semiconductor chip (10) to the interconnecting pattern (52) and being disposed in the holes.

32 Claims, 16 Drawing Sheets

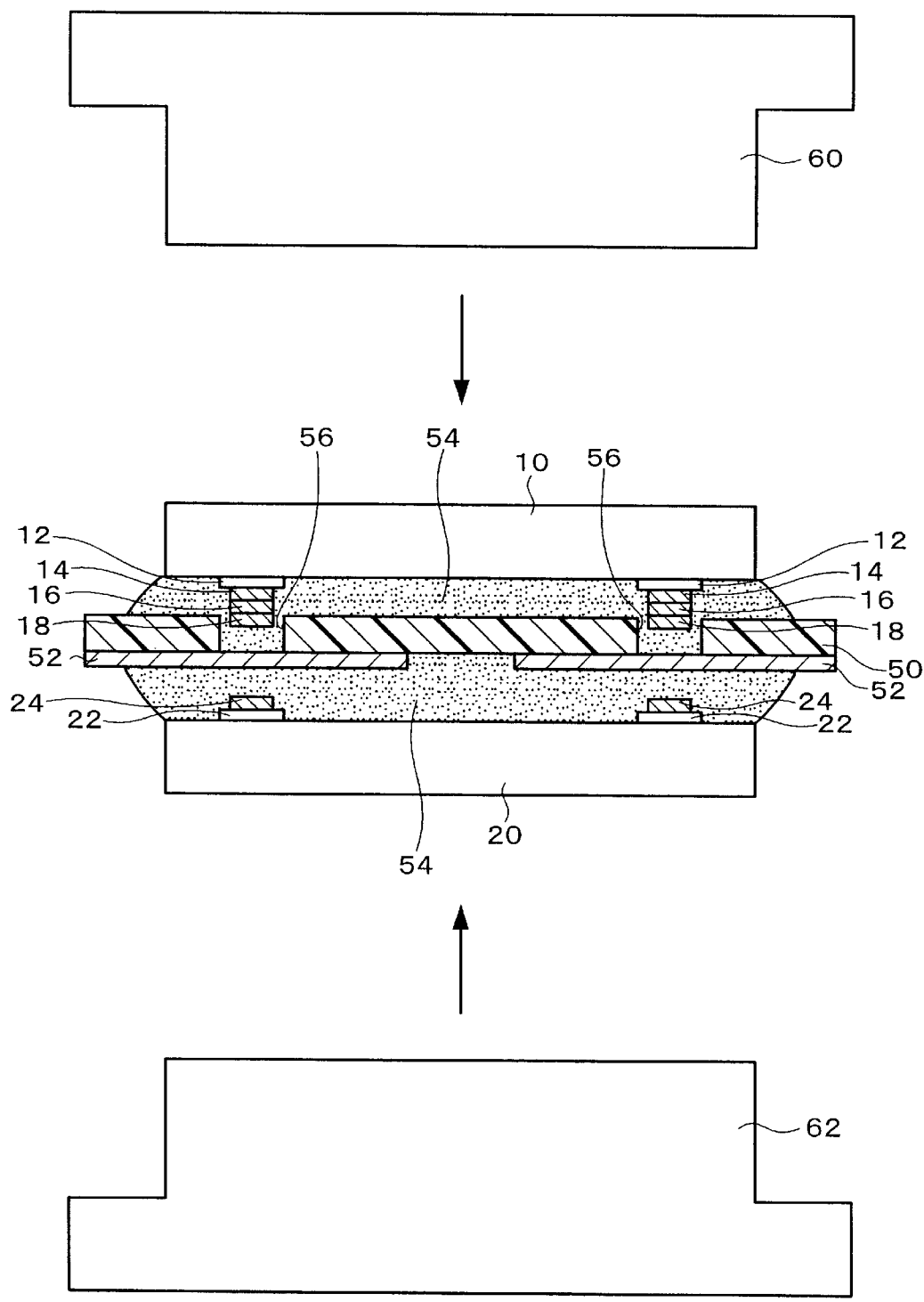

SEMICONDUCTOR DEVICE AND METHOD OF MANUFACTURING THE SAME, MANUFACTURING DEVICE, CIRCUIT BOARD, AND ELECTRONIC EQUIPMENT

TECHNICAL FIELD

The present invention relates to a semiconductor device and a method of manufacturing the same, a manufacturing device, a circuit board, and electronic equipment.

BACKGROUND OF ART

Accompanied by miniaturization of electronic equipment, multichip modules including a plurality of semiconductor chips at high density have been developed. Since a plurality of existing semiconductor chips can be used in the multichip modules, cost can be reduced in comparison with the case of designing an original integrated circuit.

In the multichip modules, a plurality of semiconductor chips is mounted on the surface of a substrate on which an interconnecting pattern is formed and the substrate is bent to form a multilayer structure, for example. As multichip modules which can achieve miniaturization and an increase in density, semiconductor modules in which a plurality of semiconductor chips is mounted on both surfaces of the substrate and the substrate is bent are known. However, in such semiconductor modules, the interconnecting patterns must be formed on both surfaces of the substrate, and via-holes for allowing these interconnecting patterns to be electrically connected are needed, thereby increasing cost and the number of manufacturing steps.

DISCLOSURE OF INVENTION

The present invention has been achieved to solve this problem. An objective of the present invention is to provide a semiconductor device and a method of manufacturing the same which can achieve a miniaturized high-density multichip module, a manufacturing device, a circuit board, and electronic. equipment without decreasing productivity.

(1) A semiconductor device according to the present invention comprises:

at least one substrate including a plurality of holes formed therein and an interconnecting pattern provided to one surface of the substrate, part of the interconnecting pattern being formed so as to overlap with the holes, at least one first semiconductor chip including a plurality of electrodes and provided to another surface of the substrate, at least one second semiconductor chip including a plurality of electrodes and provided to the one surface of the substrate, and a conductive member disposed in each of the holes for electrically connecting each of the electrodes of the first semiconductor chip to the interconnecting pattern.

In to the present invention, a plurality of semiconductor chips can be provided to both surfaces of the substrate with the interconnecting pattern provided to one surface. Therefore, cost and the number of mounting steps can be reduced in comparison with a substrate with the interconnecting patterns formed over both surfaces. Moreover, the weight of the semiconductor device can be reduced. Because of this, a multichip module excelling in productivity can be developed.

(2) In this semiconductor device, the first semiconductor chip and the second semiconductor chip may have sections overlapping each other in plane view.

This enables the planar area for mounting the semiconductor chips to be efficiently utilized.

(3) In this semiconductor device, the electrodes of at least one of the first semiconductor chip and the second semiconductor chip may be connected to the interconnecting pattern by wire bonding.

This enables the present invention to be applied by using a wire as the conductive member.

(4) In this semiconductor device, at least one of the first semiconductor chip and the second semiconductor chip may be bonded face down.

(5) In this semiconductor device, the first semiconductor chip and the second semiconductor chip may be bonded face down, and the electrodes of the first semiconductor chip may be disposed in the holes.

(6) In this semiconductor device, a resin may be provided between the substrate and the first semiconductor chip.

The resin has a function of reducing stress.

(7) In this semiconductor device, a resin may be provided between the substrate and the second semiconductor chip.

The resin can be provided on each semiconductor chip.

(8) In this semiconductor device, the resin may be an anisotropic conductive material including conductive particles.

(9) In this semiconductor device, a plurality of the substrates may be provided, and part of the interconnecting patterns of a pair of the substrates may be disposed facing each other for electrical connection between the interconnecting patterns.

This enables a semiconductor device comprising a plurality of substrates to be used, whereby a greater number of semiconductor chips can be positioned.

(10) In this semiconductor device, the substrate may be bent.

According to this semiconductor device, since each semiconductor chip is stacked through the substrate by bending the substrate, the planar area of the semiconductor device can be decreased.

(11) In this semiconductor device, a plurality of at least one of the first semiconductor chips and the second semiconductor chips may be provided, and the plurality of at least one of the first semiconductor chips and the second semiconductor chips may be stacked.

This enables the planar area of the semiconductor device to be decreased.

(12) In this semiconductor device, the conductive member may be a plurality of layered bumps.

The conductive member can be formed by layering the bumps.

(13) In this semiconductor device, the first semiconductor chip and the second semiconductor chip may have the same outer shape.

(14) In this semiconductor device, the second semiconductor chip may have a mirror-symmetrical circuit structure with the first semiconductor chip.

This enables each of a pair of the semiconductor chips having a mirror-symmetrical circuit structure to be connected to both sides of the interconnecting pattern.

(15) In this semiconductor device, the electrodes of the second semiconductor chip may be connected to the interconnecting pattern over the holes.

Specifically, the electrodes may be disposed on both side of the interconnecting pattern respectively at the direct opposite position from each other.

(16) In this semiconductor device, the electrodes of the second semiconductor chip may be connected to the interconnecting pattern at a position avoiding the holes.

This enables the first and second semiconductor chips having different electrode arrangement to be positioned, for example.

(17) In this semiconductor device, a plurality of external terminals electrically connected to the first and second semiconductor chips may be formed on the substrate in a region other than a region in which the semiconductor chips are formed.

(18) In this semiconductor device, a plurality of external terminals may be formed over the interconnecting patterns avoiding a region in which at least one of the first semiconductor chip and the second semiconductor chip is formed.

(19) In this semiconductor device, the external terminals may be formed on one of the pair of interconnecting patterns in a region in which part of the interconnecting patterns are connected to each other.

This enables electrical connection to be established through the external terminals formed in the same region in case that a plurality of substrates are provided.

(20) In this semiconductor device, a plurality of through-holes may be formed in the substrate, part of the interconnecting pattern may run over the through-holes, and the external terminals project through the through-holes to a surface of the substrate to which the first semiconductor chip may be provided.

(21) A circuit board according to the present invention is provided with the above semiconductor device.

(22) Electronic equipment .according to the present invention has the above semiconductor device.

(23) A method of manufacturing a semiconductor device according to the present invention comprises:

a step of mounting a first semiconductor chip over one surface of a substrate which includes a plurality of holes and an interconnecting pattern formed over another surface, part of the interconnecting pattern running over the holes; and a step of positioning a second semiconductor chip on the other surface of the substrate over which the interconnecting pattern is formed, wherein, in the step of mounting the first semiconductor chip, electrodes of the first semiconductor chip are electrically connected to the interconnecting pattern through a conductive member provided in each of the holes by disposing the electrodes of the first semiconductor chip in the holes.

According to the present invention, a plurality of semiconductor chips can be provided to both surfaces of the substrate with the interconnecting pattern formed over one surface. Therefore, cost and the number of mounting steps can be reduced in comparison with a substrate with an interconnecting pattern provided to both surfaces. Moreover, the weight of the semiconductor device can be reduced. Because of this, a multichip module excelling in productivity can be developed.

(24) In this method of manufacturing a semiconductor device, the conductive member may be at least one bump, and the method may further comprise a step of providing the bump to each of the electrodes of the first semiconductor chip in advance.

(25) This method of manufacturing a semiconductor device may further comprise a step of providing a resin to the substrate in a region in which the first semiconductor chip is positioned.

The resin has a function of reducing stress.

(26) This method of manufacturing a semiconductor device may further comprise a step of providing a resin to the substrate in a region in which the second semiconductor chip is positioned.

The resins can be provided over each semiconductor chip.

(27) In this method of manufacturing a semiconductor device, a step of providing a resin between the substrate and the first semiconductor chip and a step of providing a resin between the substrate and the second semiconductor chip may be carried out at the same time.

According to this method, the resins may be provided to both surfaces of the substrate at the same time. Therefore, in the case where the opening of the holes is not covered by the interconnecting pattern, specifically, in the case where the resin flows through the opening of the holes when providing the resin over one surface of the substrate, the resin can be efficiently provided.

(28) This method of manufacturing a semiconductor device may further comprise, after the step of providing the resin, a step of providing the first and second semiconductor chips to the substrate and applying pressure and heat to surfaces of the first and second semiconductor chips opposite to surfaces facing the substrate.

This enables each semiconductor chip to be placed symmetrically with respect to the substrate by mounting each semiconductor chip provided to both surfaces of the substrate, whereby optimum mounting conditions can be obtained.

(29) In this method of manufacturing a semiconductor device, the second semiconductor. chip may-have a mirror-symmetrical circuit structure with the first semiconductor chip.

This enables a pair of the semiconductor chips having a mirror-symmetrical circuit structure to be connected to both sides of the interconnecting patterns.

(30) In this method of manufacturing a semiconductor device, the electrodes of the second semiconductor chip may be connected to the interconnecting pattern over the holes.

(31) In this method of manufacturing a semiconductor device, the electrodes of the second semiconductor chip may be connected to the interconnecting pattern at a position avoiding the holes.

(32) A manufacturing device for a semiconductor device according to the present invention comprises:

first and second jigs each of which is disposed leaving a space from a surface of each of a plurality of semiconductor chips opposite to a surface facing a substrate, the semiconductor chips being mounted over both surfaces of the substrate through a resin, wherein each of the first and second jigs comprises a surface for applying pressure to a surface of each of the semiconductor chips opposite to the surface facing a substrate and heating means for transmitting heat to each of the semiconductor chips, and the first and second jigs apply pressure and heat to the respective semiconductor chips positioned between the first and second jigs at the same time to make adhesive force of resin on the substrate effective so that the semiconductor chips are mounted over the substrate.

According to the present invention, the semiconductor chips provided to both surfaces of the substrate are mounted over the substrate by simultaneously applying pressure and heat to the semiconductor chips. At the same time, adhesive force of the resin on the substrate can be made effective. Therefore, a semiconductor device can be manufactured using a reduced number of steps. Moreover, since the semiconductor chips provided to both surfaces of the substrate are mounted simultaneously, each semiconductor chip is mounted symmetrically. This enables the semiconductor device to be manufactured under optimum mounting conditions.

BRIEF DESCRIPTION OF DRAWINGS

FIG. 4 is a view showing a method of manufacturing a semiconductor device according to the first embodiment to which the present invention is applied.

BEST MODE FOR CARRYING OUT THE INVENTION

Preferred embodiments of the present invention are described below with reference to the drawings. The package type of a semiconductor device according to the present invention may be any of BGA (Ball Grid Array), CSP (Chip Size/Scale Package), and the like. The present invention may be applied to face-down type semiconductor devices and a module structure thereof. As examples of the face-down type semiconductor devices, semiconductor devices with a COF (Chip On Flex/Film) structure, COB (Chip On Board) structure, and the like can be given. These semiconductor devices not only include semiconductor chips mounted therein, but also may have a module structure in which passive devices such as an SMD (Surface Mount Device) such as a resistance and a capacitor are appropriately included in combination, as described later.

First Embodiment

Figure 1:
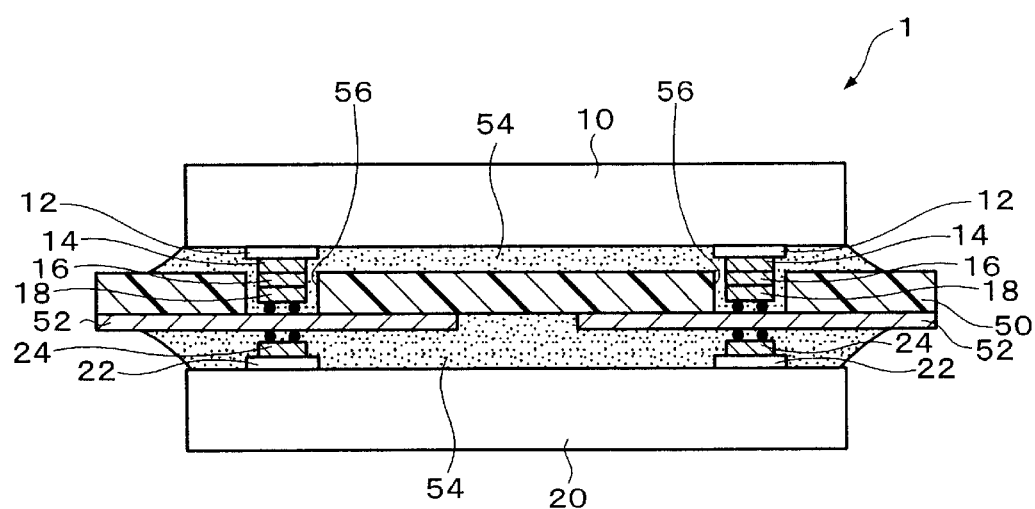
FIG. 1 is a view showing a semiconductor device according to a first embodiment to which the present invention is applied.

FIG. 1 is a view showing a semiconductor device according to the present embodiment. FIGS. 2A to 4 are views showing a method of manufacturing the semiconductor device according to the present embodiment. A semiconductor device 1 includes first and second semiconductor chips 10 and 20 and a substrate 50.

The first semiconductor chip 10 has one or a plurality of electrodes (or pads) 12. The electrodes 12 are generally thin and flat, formed on the first semiconductor chip 10 using aluminum or copper, for example. The electrodes 12 may be formed flat with the surface of the first semiconductor chip 10. There are no specific limitations to the shape of the side or vertical cross section of the electrodes 12. The planar shape of the electrodes 12 is not particularly limited. The electrodes 12 may be either circular or rectangular. A passivation film (not shown) may be formed on the first semiconductor chip 10 so as to avoid part of the electrodes 12. The passivation film may be formed using $SiO_2$, SiN, polyimide resin, or the like.

The first semiconductor chip 10 includes first to third bumps 14, 16, and 18 formed on the electrodes 12. Each bump is layered on the electrodes 12 and is electrically conducting. In the present invention, conductive members formed on the electrodes 12 are not limited to the bumps. In the present embodiment, the number of bumps is arbitrary. At least one bump may be formed on the electrodes 12.

The second semiconductor chip 20 may have the same structure as the first semiconductor chip 10. Accordingly, conductive members may be formed on electrodes 22 of the second semiconductor chip 20, and the conductive members may be at least one bump. In the present embodiment, bumps 24 are formed on the electrodes 22. In the example shown in FIG. 1, the first and second semiconductor chips 10 and 20 are equal in size.

The substrate 50 may be formed using any organic or inorganic material or formed of a composite structure of these materials. As examples of the substrate 50 formed using an organic material, a two-layer or three-layer flexible substrate formed of a polyimide resin and the like can be given. A tape used in TAB technology may be used as the flexible substrate. As examples of the substrate, 50 formed using an inorganic material, a ceramic substrate, a glass substrate, and the like can be given. As examples of a substrate formed of a composite structure of organic and inorganic materials, a glass epoxy substrate and the like can be given. There are no specific limitations to the planar shape of the substrate 50. It is preferable that the substrate 50 be similar in shape to the first and second semiconductor chips 10 and 20. Note that a double-faced substrate, multilayer substrate, built-up substrate, or the like may be used in the case where an increase in cost accompanied by complication of the substrate interconnection in the embodiment described below is smaller than the cost reduction effect due to double-faced mounting of the semiconductor chips.

The interconnecting patterns 52 are formed on the substrate 50. The interconnecting patterns 52 are formed on one surface of the substrate 50. The interconnecting patterns 52 are formed by etching copper foil in many cases. The interconnecting patterns 52 may be formed of two or more layers. Copper foil is generally bonded to the substrate 50 in advance through an adhesive (not shown). As other examples, the interconnecting patterns 52 may be formed by etching a layer of any of copper (Cu), chromium (Cr), titanium (Ti), nickel (Ni), and titanium tungsten (Ti—W). The interconnecting patterns 52 may be formed on the substrate 50 by an additive process. The interconnecting patterns 52 may be formed by photolithography, sputtering, and plating. Part of the interconnecting patterns 52 may be land sections (not shown) having an area larger than the section which becomes the wiring. The land sections have a function of securing the electrical connection sections sufficiently. Therefore, the land sections may be formed in the connection sections with the electrodes 12 and 22 and the connection sections with the external terminals 90 described later.

A plurality of holes 56 is formed in the substrate 50. The holes 56 are formed so as to have a planar shape smaller than the first semiconductor chip 10. The conductive members (first to third bumps 14, 16, and 18) formed on the electrodes 12 of the first semiconductor chip 10 are inserted into the holes 56. The height of the conductive members is such that the electrodes 12 of the semiconductor chip 10 are electrically connected to the interconnecting patterns 52 (land sections) For example, the electrodes 12 may be electrically connected to the interconnecting patterns 52 using only the first bump 14 by increasing the bump height.

The holes 56 are formed on the substrate 50 inside the mounting region of the first semiconductor chip 10 according to the arrangement and the number of electrodes 12. Each electrode 12 is inserted into any of the holes 56. The number of holes 56 may be the same as the number of electrodes 12. For example, a plurality of holes 56 may be formed along two surfaces of the substrate 50 facing each other inside the mounting region of the first semiconductor chip 10 corresponding to the electrodes 12 formed along two surfaces of the semiconductor chip 10 facing each other. One conductive member may be inserted into one hole 56. The holes 56 have a cross-sectional area which allows insertion of the conductive members. The shape of the holes 56 may be either circular or rectangular. The holes 56 are formed through the substrate 50. The interconnecting patterns 52 formed on one surface of the substrate 50 may close one of the openings of the holes 56. Specifically, the land sections may close the opening of the holes 56 on the surface on which the interconnecting patterns 52 are formed. It is preferable that the conductive members be formed to have a height greater than the thickness of the substrate 50 so as to be electrically connected to the interconnecting patterns 52 (land sections).

As a modification example of the holes of the present embodiment, at least one slit may be formed in the substrate 50 in place of the holes 56. The slits are formed to correspond to the rows of the electrodes 12 of the first semiconductor chip 10. Long, narrow slits may be formed. For example, two slits maybe formed along two surfaces of the substrate 50 facing each other inside the mounting region of the first semiconductor chip 10 corresponding to the rows of the electrodes 12 formed in opposition along the two surfaces of the semiconductor chip 10. The slit may be divided into desired lengths. The interconnecting patterns 52 are formed across the slit. When long, narrow slits are formed, the interconnecting patterns 52 are formed across the slits in the direction of the width of the slits. A plurality of land sections is disposed on the slit. A plurality of conductive members may be inserted into one slit. The size and shape of the slits may be optionally determined according to the arrangement of the electrodes 12. Necessary through-holes can be easily formed without forming minute holes in the substrate 50 by forming the slits.

The first semiconductor chip 10 is mounted on the surface of the substrate 50 on which the interconnecting patterns 52 are not formed with the surface on which the electrodes 12 are formed facing the substrate 50. Specifically, the conductive members formed on the electrodes 12 are inserted into the holes 56 and electrically connected to the interconnecting patterns 52 (land sections) formed on one of the openings of the holes 56. Specifically, the conductive members are electrically connected to the interconnecting patterns 52 (land sections) exposed by the holes 56.

This enables the first and second semiconductor chips 10 and 20 to be mounted on opposite surfaces of the substrate 50 with the interconnecting patterns 52 formed on one surface. Therefore, cost and number of the mounting steps can be decreased in comparison with a substrate with interconnecting patterns formed on both surfaces. Moreover, the weight of the semiconductor device can be reduced. Because of this, a multichip module excelling in productivity can be developed.

In the present invention, the conductive members are not limited to bumps. Conductive paste, conductive balls, or the like may be used as the conductive members. The conductive members may be formed in the holes 56 of the substrate 50 on which the interconnecting patterns 52 (land sections) are formed. These conductive members and the conductive members formed on the surface of the semiconductor chip 10 may be collectively used as the conductive members.

In the present embodiment, the first and second semiconductor chips 10 and 20 are equal in size. Therefore, the electrodes 12 and 22 may be connected with the interconnecting pattern 52 interposed therebetween. In other words, although the electrodes 12 and 22 are connected to opposite sides of the interconnecting patterns 52 (land section), the connection sections with the interconnecting patterns 52 may be at the same position on a plane. In the case where the semiconductor chips 10 and 20 have a mirror-symmetrical circuit structure, both devices can be electrically connected from the same external terminal 90 (including one which replaces external terminal 90; see FIG. 10). In the case where the semiconductor chips 10 and 20 are memories, for example, information can be read out from or written into memory cells of each memory at the same address from the external terminal 90 in the same arrangement. Moreover, at least two semiconductor chips can be separately controlled using the same external terminal arrangement by separating the first and second semiconductor chips 10 and 20 merely by the connection of a chip-select terminal. For example, a chip select function may be provided by, among at least two electrodes 12 and at least two electrodes 22 which form pairs therewith through the substrate 50, allowing either the electrode 12 or the electrode 22 which form the pair through the substrate 50 to be electrically connected to the interconnecting patterns 52. Moreover, a chip select function may be provided by selectively forming the holes 56 for electrically connecting the electrodes 12 or electrodes 22 to the interconnecting patterns 52. In the present invention, at least one first semiconductor chip 10 and at least one second semiconductor chip 20 are formed. A plurality of first semiconductor chips and a plurality of second semiconductor chips may be provided.

A resin may be provided between the first semiconductor chip 10 and the substrate 50. Specifically, a resin may be provided on the surface of the substrate 50 on which the interconnecting patterns 52 are not formed at least in the mounting region of the first semiconductor chip 10 (including the holes 56). A resin may be provided between the second semiconductor chip 20 and the substrate 50. The resin provided on the second semiconductor chip 20 may be the same material as the resin provided on the first semiconductor chip 10.

In the present embodiment, resins are provided both between the first semiconductor chip 10 and the substrate 50 and between the second semiconductor chip 20 and the substrate 50. The resin may be an anisotropic conductive material 54. The anisotropic conductive material 54 is prepared by dispersing conductive particles (fillers) in an adhesive (binder). A dispersing agent may be added. A heat-curable adhesive is generally used as the adhesive for the anisotropic conductive material 54. As the anisotropic conductive material 54, an anisotropic conductive film previously formed into a sheet is generally used. A liquid material may also be used. The anisotropic conductive material 54 is pressed between the conductive members and the interconnecting patterns 52, thereby establishing electrical connection between them through the conductive particles. The present invention is not limited to this. As the method of establishing electrical connection between the conductive members of the first and second semiconductor chips 10 and 20 and the interconnecting patterns 52, a method using conductive resin paste, a method using a metal junction such as Au—Au, Au—Sn, or solder, a method utilizing the shrinkage force of an insulating resin, and the like can be given. Any of these methods may be used. In the case of using any of these face down mounting methods, an insulating resin is generally sealed between the semiconductor chips and the substrate in order to improve reliability by decreasing thermal stress. In addition, the anisotropic conductive material serves as both an adhesive and electrical conduction.

The surface of the substrate 50 opposite to the surface on which the interconnecting patterns 52 are formed may be coarsened at least in the region in which the anisotropic conductive material 54 is provided. Specifically, the surface of the substrate 50 may be coarsened so as to impair flatness. The surface of the substrate 50 may be coarsened mechanically by sandblasting, physically using plasma or ultraviolet rays, or chemically using an etching material. This enables the substrate 50 and the anisotropic conductive. material 54 to be bonded more securely by increasing the bonding area between the substrate 50 and the anisotropic conductive material 54 or increasing physical and chemical adhesive force.

A recognition hole (not shown) and a recognition pattern (not shown) formed on the recognition hole may be provided on the substrate 50. The conductive members can be easily and securely inserted into the holes 56 by using the recognition hole and the recognition pattern. Therefore, it is preferable that the recognition hole and the recognition pattern be formed in the region of the substrate 50 so as to avoid the mounting region of the first semiconductor chip 10. There are no specific limitations to the shape and size of the recognition hole insofar as the recognition pattern can be recognized. The recognition pattern may be formed across the recognition hole, and the shape of the recognition pattern is not limited. The recognition pattern is formed on the opening of the recognition hole on the surface of the substrate 50 on which the interconnecting patterns 52,are formed. For example, the recognition pattern may be formed by a first pattern which extends in the X axis direction among two-dimensional coordinates established on the surface of the substrate 50 and a second pattern which extends in the Y axis direction. The recognition pattern preferably has a structure in which the position of the semiconductor chip 10 on the surface of the substrate can be recognized two-dimensionally. In the case where the substrate 50 exhibits light transmissibility, the holes 56 are not necessarily formed. In this case, the recognition pattern is recognized through the substrate 50. Part or all of the land sections, external terminals, and interconnecting patterns may be used as the recognition pattern. Holes, marks formed by printing, laser processing, or the like may be used as the recognition pattern.

According to the present embodiment, the first and second semiconductor chips 10 and 20 can be mounted on both surfaces of the substrate 50 with the interconnecting patterns 52 formed on one surface. Therefore, the cost and the number of mounting steps can be reduced in comparison with a substrate with the interconnecting patterns formed on both surfaces. Moreover, the weight of the semiconductor device can be reduced. Because of this, a multichip module excelling in productivity can be developed.

A method of manufacturing the semiconductor device according to the present embodiment is described below.

FIGS. 2A to 3B are views showing a method of forming the bumps on the electrodes of the semiconductor chips as an example of a method of forming the conductive members. Specifically, FIGS. 2A to 3B are views showing a method of forming the first bumps 14. The conductive members are formed between the electrodes 12 of the first semiconductor chip 10 and the interconnecting patterns 52. The conductive members may be formed in advance on the electrodes 12, or may be formed on the interconnecting patterns 52. In the present embodiment, the first to third bumps 14, 16, and 18 formed on the electrodes 12 of the first semiconductor chip 10 represent an arbitrary number of bumps. The present embodiment can be applied to at least one bump.

Figure 2A:
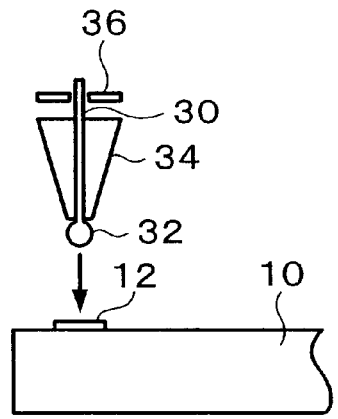
FIGS. 2A to 2C are views for describing a step of bonding a conductive line in the first embodiment of the present invention.

A capillary 34 is disposed on the surface of the first semiconductor chip 10 on which the electrodes 12 are formed, as shown in FIG. 2A. A conductive line 30 such as a wire is inserted into the capillary 34. The conductive line 30 is generally formed using gold, gold-tin, solder, copper, aluminum, or the like, although the material is not limited insofar as the material exhibits conductivity. A ball 32 is formed on the conductive line 30 outside the capillary 34. The ball 32 is formed by discharging electricity at a high voltage to the end of the conductive line 30 using an electric flame off, for example.

In this step, the conductive line 30 for forming the first bumps 14 and the conductive line 30 for forming the second bumps 16 (not shown) may be either the same or different. Specifically, each of the first to third bumps 14, 16, and 18 may be selected as required insofar as the members exhibit conductivity.

Figure 2B:
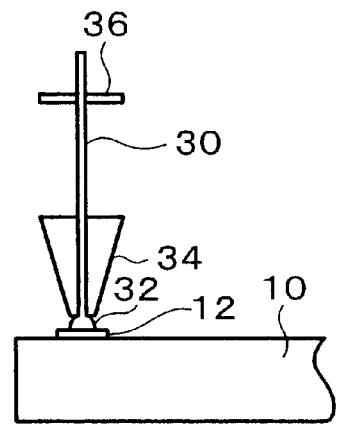
Figure 2C:
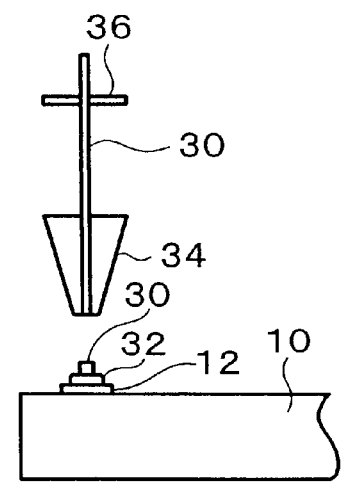

The capillary 34 is disposed above any one of the electrodes 12, thereby disposing the ball 32 above the electrode 12. The capillary 34 is lowered by opening the clamper 36, thereby pressing the ball 32 against the electrode 12. Ultrasonic vibration, heat, and the like are applied while bonding the ball 32 to the electrode 12 by pressing the ball 32 at a uniform pressure. The conductive line 30 is thus bonded to the electrode 12, as shown in FIG. 2B.

The conductive line 30 is held by closing the damper 36. The capillary 34 and the damper 36 are simultaneously lifted as shown in FIG. 1C. The conductive line 30 is cut, whereby the section including the ball 32 remains on the electrode 12. In the case where the bumps must be formed on a plurality of electrodes 12, these steps may be repeated for each electrode 12.

The part of the conductive line 30 remaining on the electrode 12 (including the ball 32) generally has a convex shape formed by the conductive line 30 cut on the bonded ball 32 or by looping.

Figure 3A:
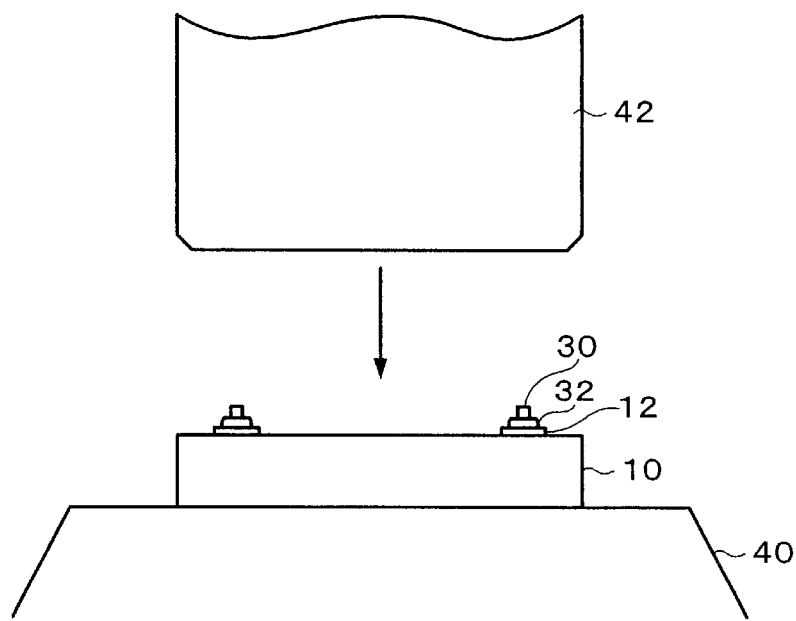
FIGS. 3A and 3B are views for describing a method of forming conductive members in the first embodiment of the present invention.
Figure 3B:
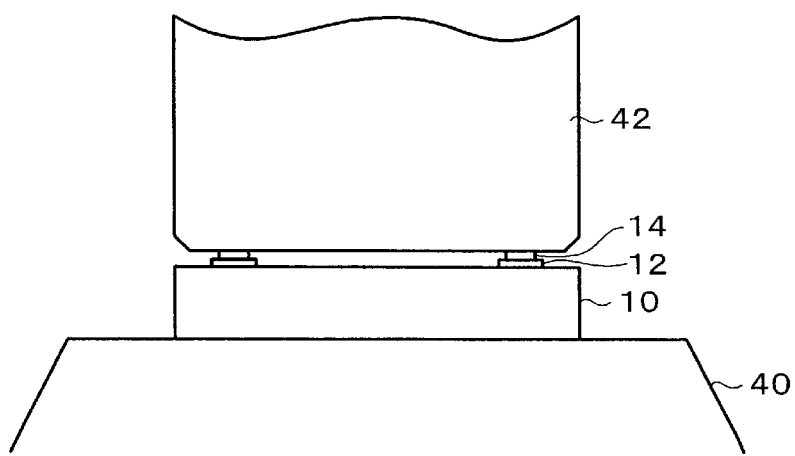

The steps shown in FIGS. 3A and 3B are then carried out. Specifically, the first semiconductor chip 10 to which part of the conductive line 30 bonded to the electrode 12 (including the ball 32) remains is placed on a stand 40, as shown in FIG. 3A. Part of the conductive line 30 is crushed, using a press jig 42, as shown in FIG. 3B. In the present embodiment, part of the conductive lines 30 remaining on a plurality of electrodes 12 is crushed at the same time. Part of the conductive line 30 may be crushed for every electrode 12 (flattening step). In this step, a bonder for gang bonding or a bonder for single point bonding may be used.

The first bump 14 is thus formed on each electrode 12, as shown in FIG. 3B. It is preferable that the upper end of the first bump 14 crushed by the press jig 42 be flat.

The method of forming the second bump 16 is the same as the method illustrated in FIGS. 2A to 3B except that the first bump 14 is previously formed on the electrode 12. The third bumps are formed on the first and second bumps 14 and 16 layered on the electrode 12. It is preferable that the second and third bumps 16 and 18 be formed perpendicularly to the first bumps 14.

These steps are illustrated for the first semiconductor chip 10. Conductive members may be formed on the electrodes 22 of the second semiconductor chip 20. The bumps 24 may be formed as the conductive members. The bumps 24 may be formed in the same manner as in these steps. Although only one bump 24 is formed in FIG. 1, a plurality of bumps may be layered as required.

Bumps other than the first bump 14 (second bump 16, for example) may be formed using a material differing from the first bump 14 according to the above method of mounting the semiconductor chip. In the case where the first bump 14 is formed using gold and the second bump 16 is formed using a metal having a melting point lower than gold such as gold-tinor solder, for example, the flattening step after forming the second bump 16 can be carried out using a wet back process by heating for melting or the like, whereby the manufacturing steps can be simplified. The semiconductor chips are mounted using the bumps as brazing materials.

In the present embodiment, an example of the ball bumps using bonding wire is described. As the method of forming the bumps, a conventional electroplating technique, electroless plating technique, paste printing technique, ball placement technique, or a combination of these techniques may be used. Bumps may be formed on the interconnecting patterns 52 and used as the conductive members.

FIG. 4 is a view showing a method of manufacturing the semiconductor device according to the present embodiment.

The first semiconductor chip 10 is mounted on the substrate 50. Specifically, the first semiconductor chip 10 is bonded face down to the surface of the substrate 50 opposite to the surface on which the interconnecting patterns 52 are formed. In this step, the type of face down bonding is not limited. In the case where the recognition hole and the recognition pattern are formed on the substrate 50, the first semiconductor chip 10 may be mounted while recognizing the position of the first semiconductor chip 10 on the substrate 50 by using the recognition hole and the recognition pattern. The conductive members (first to third bumps 14, 16, and 18) are inserted into the holes 56 and connected to the interconnecting patterns 52. The conductive members can be electrically connected to the interconnecting patterns 52 by applying heat/pressure, ultrasonic vibration, and the like to the first semiconductor chip 10 in the direction of the substrate 50.

The second semiconductor chip 20 is bonded face down to the surface of the substrate 50 on which the interconnecting patterns 52 are formed. Specifically, the second semiconductor chip is mounted on the side of the interconnecting patterns 52 opposite to the first semiconductor chip 10. In this step, the type of face down bonding is not limited. The second semiconductor chip 20 may be mounted at a symmetrical position with the first semiconductor chip 10 through the interconnecting patterns 52. In other words, the electrodes 22 (bumps 24) and the electrodes 12 (first to third bumps 14, 16, and 18) of the first semiconductor chip 10 may be connected through the interconnecting patterns 52. Specifically, the electrodes 22 (bumps 24) may be connected to part of the interconnecting patterns 52 in the region running over the holes 56. It is preferable that all the bumps be symmetrically located on the substrate 50. This is so that the first semiconductor chip 10 and the second semiconductor chip 20 can be balanced if all bumps are located at a symmetrical position.

Either the first semiconductor chip 10 or the second semiconductor chip 20 may be mounted in advance on the substrate 50, and the other semiconductor chip may be mounted on the substrate 50 thereafter. In this case, it is preferable to mount the first semiconductor chip 10 in advance so as to ensure the connection to become perfect by transmitting pressure to the bumps of the semiconductor chips securely. The first and second semiconductor chips 10 and 20 may be simultaneously mounted on the substrate 50. The first and second semiconductor chips 10 and 20 are bonded face down symmetrically with respect to the substrate 50 by simultaneously mounting the first and second semiconductor chips 1 and 20. Therefore, since pressure is applied from both directions to part of the interconnecting patterns 52 formed over the holes 56, application of excess stress to the interconnecting patterns 52 can be prevented. Moreover, the period of time required for mounting the semiconductor chips can be reduced by half.

Resins may be provided on the substrate 50 both in the mounting region of the first semiconductor chip 10 (including the holes 56) and in the mounting region of the second semiconductor chip 20. The resins provided in each region may be either the same material or different materials. This step may be carried out either before or after carrying out the above face down bonding step. In the case of carrying out this step after the face down bonding step, resins maybe injected through an opening formed between the first and second semiconductor chips 10 and 20 and the substrate 50. In the present embodiment, each resin is the anisotropic conductive material 54. In the present embodiment, since the first and second semiconductor chips 10 and 20 are bonded face down using the conductive particles contained in the anisotropic conductive material 54, each semiconductor chip is bonded face down after applying the anisotropic conductive material 54 on the substrate 50. In this case, electrical connection and mechanical connection between the semiconductor chips and the substrate can be established at the same time, thereby reducing a period of time required for these steps.

The resins may be first provided in either region and then provided in the other region, or the resins may be simultaneously provided in both regions. When simultaneously providing the resins, since the resins are provided on both surfaces of the substrate 50 in the case where one of the openings of the holes 56 formed in the substrate 50 is not closed by the interconnecting patterns 52, the resin can be provided efficiently. The first and second semiconductor chips 10 and 20 may be simultaneously mounted on the resins provided on both surfaces of the substrate 50.

In the method of manufacturing the semiconductor device according to the present embodiment, a manufacturing device shown in FIG. 4 is used. The manufacturing device includes first and second jigs 60 and 62.

In the case of connecting the semiconductor chips using an adhesive, anisotropic conductive material, alloy or metal junction, or the like, the following method may be employed.

The first and second jigs 60 and 62 are disposed at intervals on the surfaces of the first and second semiconductor chips 10 and 20 placed on the substrate 50 through the resins opposite to the substrate 50. The first and second jigs 60 and 62 may have a surface for applying pressure to the surfaces of the first and second semiconductor chips 10 and 20 opposite to the surface on which the electrodes are formed and include heating means for transmitting heat to each semiconductor chip. The first and second jigs 60 and 62 may be heaters. The jigs may be transparent, and the resins may be heated or cured by irradiation through the jigs.

The first and second jigs 60 and 62 may be allowed to come in contact with the surfaces of the first and second semiconductor chips 10 and 20 opposite to the surface on which the electrodes are formed, thereby heating each semiconductor chip and applying pressure directed toward the substrate 50. This enables the resins provided between the substrate 50 and the first and second semiconductor chips 10 and 20 to exhibit adhesive force, and the electrodes 12 and 22 of each semiconductor chip to be electrically connected to the interconnecting patterns 52. Moreover, since the first and second semiconductor chips 10 and 20 can be simultaneously mounted on the substrate 50, the semiconductor device can be manufactured using a reduced number of steps. Furthermore, since each semiconductor chip can be mounted symmetrically, the semiconductor device can be manufactured under optimum mounting conditions. Pressure and heat may be applied separately to the first and second semiconductor chips 10 and 20 with using the first and second jigs 60 and 62. A plurality of first and second jigs 60 and 62 may be provided according to the number of semiconductor chips mounted on the substrate 50, or only one jig may be used repeatedly.

As a step for electrically connecting the electrodes 12 and 22 of the first and second semiconductor chips 10 and 20 to the interconnecting. patterns 52, pressure and ultrasonic vibration may be applied to each semiconductor chip. The electrodes 12 and 22 can be electrically connected to the interconnecting patterns 52 securely by applying ultrasonic vibration. As a step for allowing the resins on the substrate 50 to exhibit adhesive force, energy such as heat and light may be applied. In the case of using a UV-curable resin, for example, the resins can be allowed to exhibit adhesive force by irradiation with ultraviolet rays.

Second Embodiment

Figure 5:
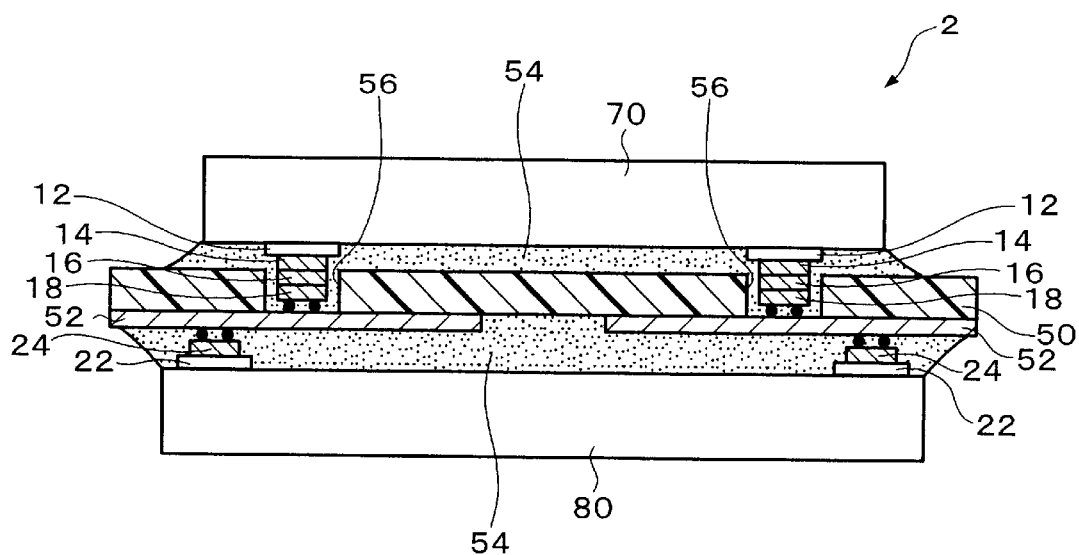
FIG. 5 is a view showing a semiconductor device according to a second embodiment to which the present invention is applied.

FIG. 5 is a view showing a semiconductor device according to the present embodiment. A semiconductor device 2 includes first and second semiconductor chips 70 and 80 and the substrate 50.

The first and second semiconductor chips 70 and 80 have the same structure as the first and second semiconductor chips 10 and 20 except that the semiconductor chips 70 and 80 differ in size. As the manufacturing method, the above-described method can be applied to the second embodiment. In FIG. 5, the first semiconductor chip 70 is smaller than the second semiconductor chip 80. The first semiconductor chip 70 may be larger than the second semiconductor chip 80. Specifically, even if the semiconductor chips differ in size, the present invention can be applied by bonding the electrodes of either semiconductor chip to the interconnecting patterns 52 at a position which avoids the electrodes of the other semiconductor chip on a plane.

Third Embodiment

Figure 6:
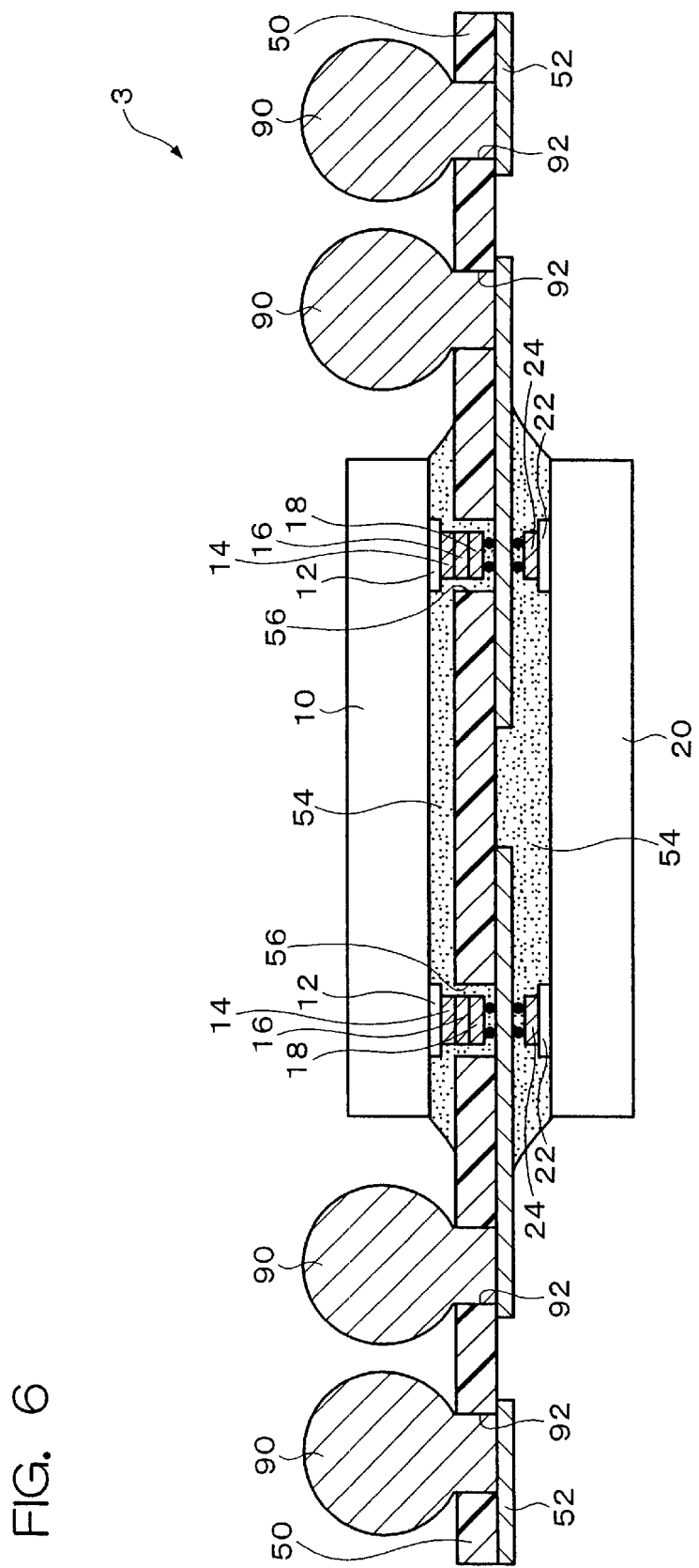
FIG. 6 is a view showing a semiconductor device according to a third embodiment to which the present invention is applied.

FIG. 6 is a view showing a semiconductor device according to the present embodiment. The semiconductor device according to the present embodiment includes the first and second semiconductor chips 10 and 20, the substrate 50, and a plurality of external terminals 90.

A plurality of external terminals 90 is formed on either the side of the interconnecting patterns 52 facing the substrate 50 or the side opposite thereto. A plurality of through-holes 92 may be formed in the substrate 50. Part of the interconnecting patterns 52 is formed on the substrate 50 so as to run over the through-holes 92. In the case where the external terminals 90 are formed on the side of the interconnecting patterns 52 facing the substrate 50, the external terminals 90 project through the through-holes 92 to the surface of the substrate 50 opposite to the surface on which the interconnecting patterns 52 are formed. Specifically, the external terminals 90 may be formed on the interconnecting patterns 52 in the region exposed by the through-holes 92.

The external terminals 90 are formed so as to avoid the mounting region of the semiconductor chip (first semiconductor chip 10 in FIG. 6) mounted on the surface of the substrate 50 from which the external terminals 90 project. In the case where the first and second semiconductor chips 10 and 20 are mounted at the center of the substrate 50, for example, the external terminals 90 may be formed on part of the interconnecting patterns 52 extending outside the semiconductor chips. Therefore, the external terminals 90 can be formed by efficiently utilizing the planar area of the substrate 50 even if the first and second semiconductor chips 10 and 20 differ in size. It is preferable that at least the semiconductor chip formed on the surface on which the external terminals 90 are formed (first semiconductor chip 10 in FIG. 6) be ground to a thickness smaller than the height of the external terminals 90 so as not to interfere with the external terminals 90.

The semiconductor device shown in FIG. 6 is referred to as a FAN-OUT semiconductor device in which the external terminals 90 are formed only outside the mounting region of the first and second semiconductor chips 10 and 20. In FIG. 6, the semiconductor chips are equal in size. The present embodiment is not limited to this, as the size may differ. This also applies to embodiments described below.

The sections of the interconnecting patterns 52 in which the external terminals 90 are formed may be land sections. A protective layer (not shown) may be formed in the region in which the surface of the interconnecting patterns 52 is exposed. It is preferable that the protective layer be an insulating member, such as a solder resist and cover and protect the surface of the interconnecting patterns 52, in particular. The external terminals 90 may be formed using solder. The external terminals 90 may be formed using a metal other than solder, a conductive resin, or a combination of these materials.

Figure 7:
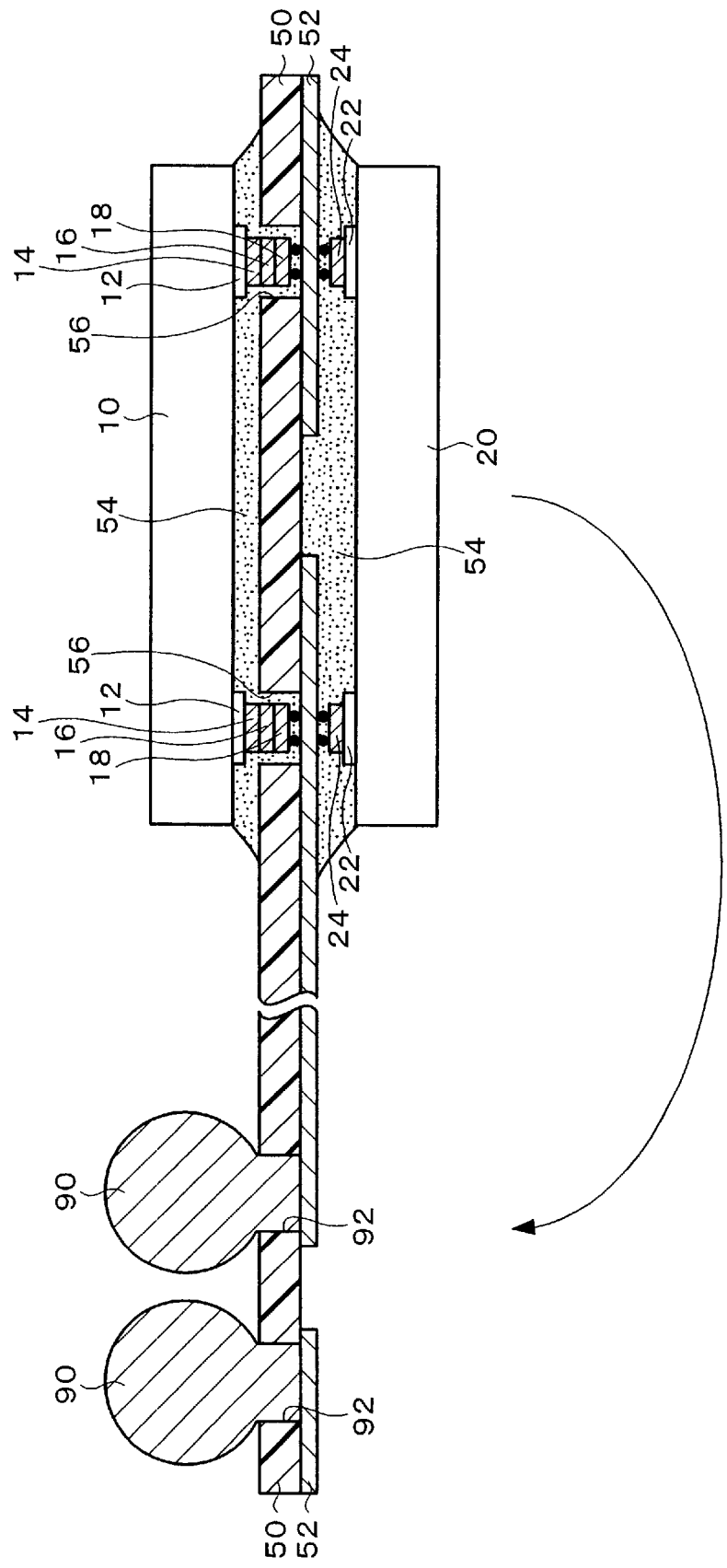
FIG. 7 is a view showing a semiconductor device according to a modification example of the third embodiment to which the present invention is applied.
Figure 8:
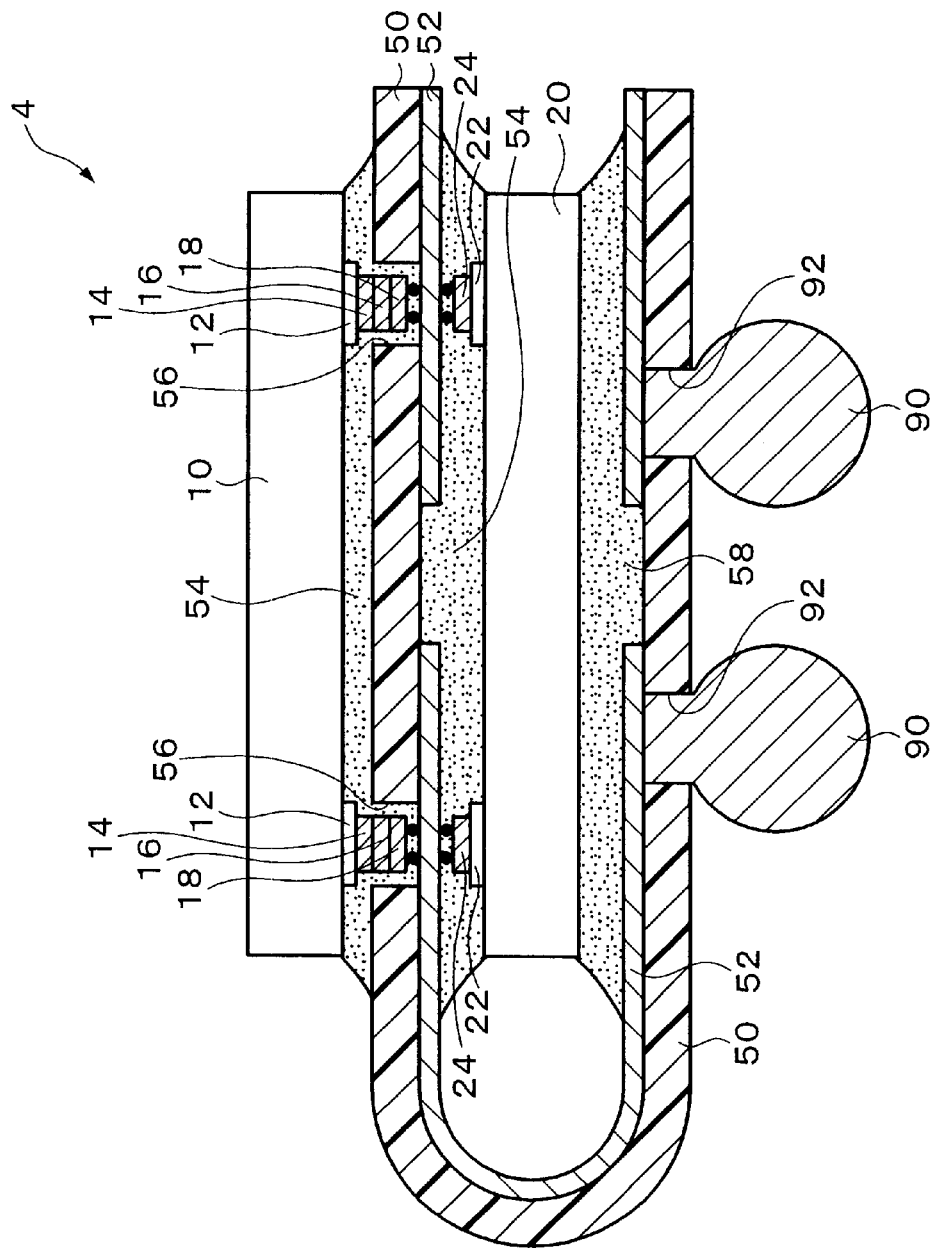
FIG. 8 is a view showing a semiconductor device according to a modification example of the third embodiment to which the present invention is applied.
Figure 9:
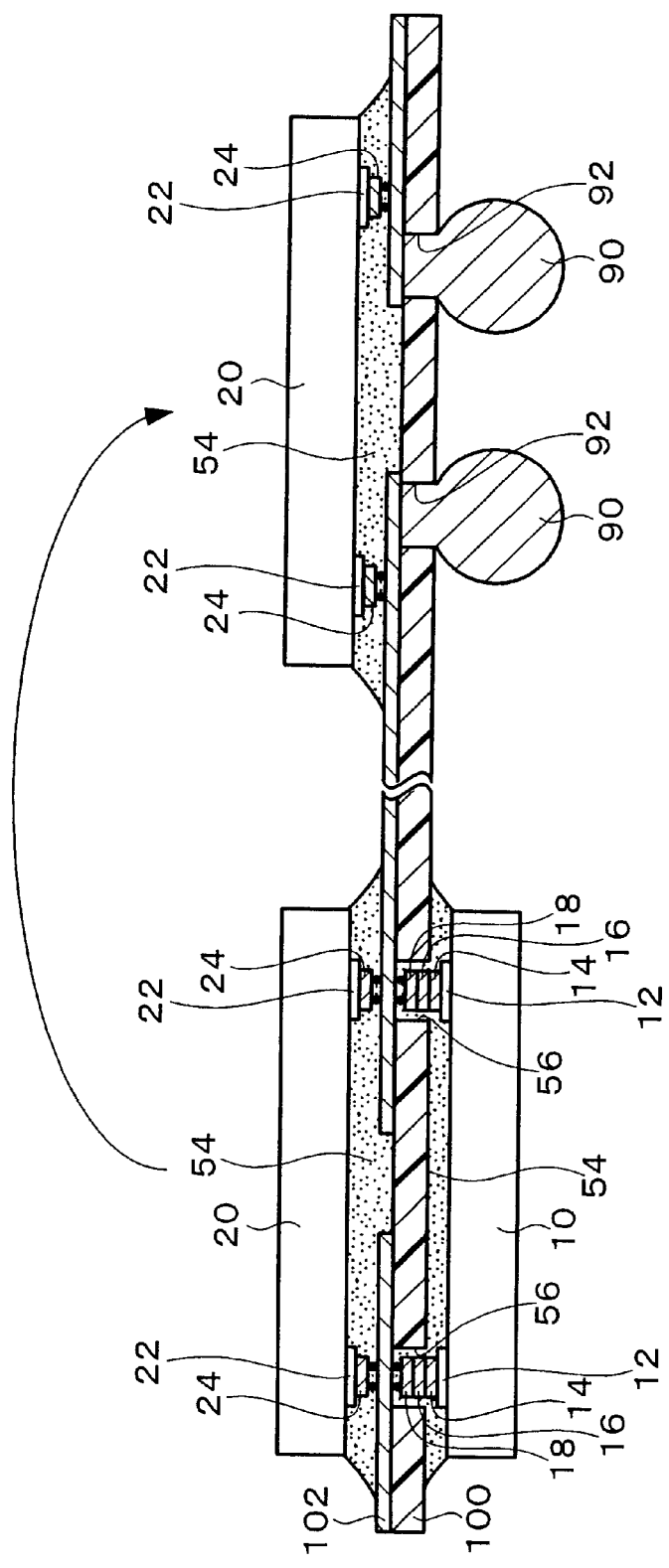
FIG. 9 is a view showing a semiconductor device according to a modification example of the third embodiment to which the present invention is applied.

FIGS. 7 to 9 are views showing a semiconductor device according to a modification example of the present embodiment. FIGS. 7 and 9 show the semiconductor device in which the substrate 50 is straight in one plane. FIG. 8 shows the semiconductor device shown in FIG. 7 of which the substrate 50 is bent.

The substrate 50 is a bendable member (conventional flexible substrate, for example). The rest of the structure of the substrate 50 is the same as described above. The configuration of a plurality of external terminals 90 is the same as described above. In the case where the substrate 50 is rectangular, the region for forming the external terminals 90 is formed in one end section of the substrate 50, and the mounting region for both the first and second semiconductor chips 10 and 20 is formed on the other end section, as shown in FIG. 7. The substrate 50 is bent so that the first and second semiconductor chips 10 and 20 face the external terminals 90 as shown in FIG. 8 to obtain a semiconductor device 4. The side of the semiconductor chip surrounded by the substrate 50 (second semiconductor chip 20 in FIG. 8) opposite to the surface on which the electrodes are formed after bending the substrate 50, may be secured to the substrate 50 facing this surface using an adhesive 58. It is preferable that the adhesive 58 exhibit solder heat resistance and be formed of a soft resin such as a silicone resin, polyimide resin, or epoxy resin in order to reduce the stress applied to the external terminals 90.

At least one first semiconductor chip 10 and at least one second semiconductor chip 20 are provided. Each of the first and second semiconductor chips 10 and 20 may be mounted at a position overlapping each other, as shown in FIG. 7. In addition, each of the first and second semiconductor chips 10 and 20 may be mounted at a position overlapping each other, and either the first or second semiconductor chip (second semiconductor chip 20 shown in FIG. 9) may be further mounted on the surface of the substrate 50 opposite to the surface from which the external terminals 90 project, as shown in FIG. 9. In the example shown in FIG. 9, a pair of semiconductor chips (second semiconductor chips 20) becomes stacked by bending the substrate 50 with the interconnecting patterns 52 present on the inner side. In this case, the surfaces of the second semiconductor chips 20 opposite to the substrate 50 are bonded together or mechanically secured. This enables the semiconductor chips to be efficiently mounted without uselessly increasing the planar area of the semiconductor device.

The semiconductor device shown in FIG. 8 is a FAN-IN semiconductor device in which the external terminals 90 are formed only inside the mounting region of the first and second semiconductor chips 10 and 20 on a plane. According to this semiconductor device, since the semiconductor chips 10 and 20 are stacked by bending the substrate 50, the planar area of the semiconductor device can be decreased. A plurality of the first semiconductor chips 10 and a plurality of second semiconductor chips 20 may be mounted on the substrate 50.

The semiconductor device may be manufactured into an LGA (Land Grid Array) semiconductor device using the sections of the interconnecting patterns 52 exposed by the through-holes 92 as the lands without positively forming the external terminals 90. This enables the cost for forming the external terminals to be reduced.

The external terminals 90 may be formed in the land sections on the side of the interconnecting patterns 52 opposite to the substrate 50, for example. In this case, the through-holes 92 may not be formed and the substrate 50 is bent in the direction opposite to the direction shown in FIG. 8. The semiconductor device may also be manufactured into an LGA semiconductor device. In this case, it is preferable to apply a resist or the like in the area other than the lands in order to prevent short circuits of the interconnecting patterns 52.

Fourth Embodiment

Figure 10:
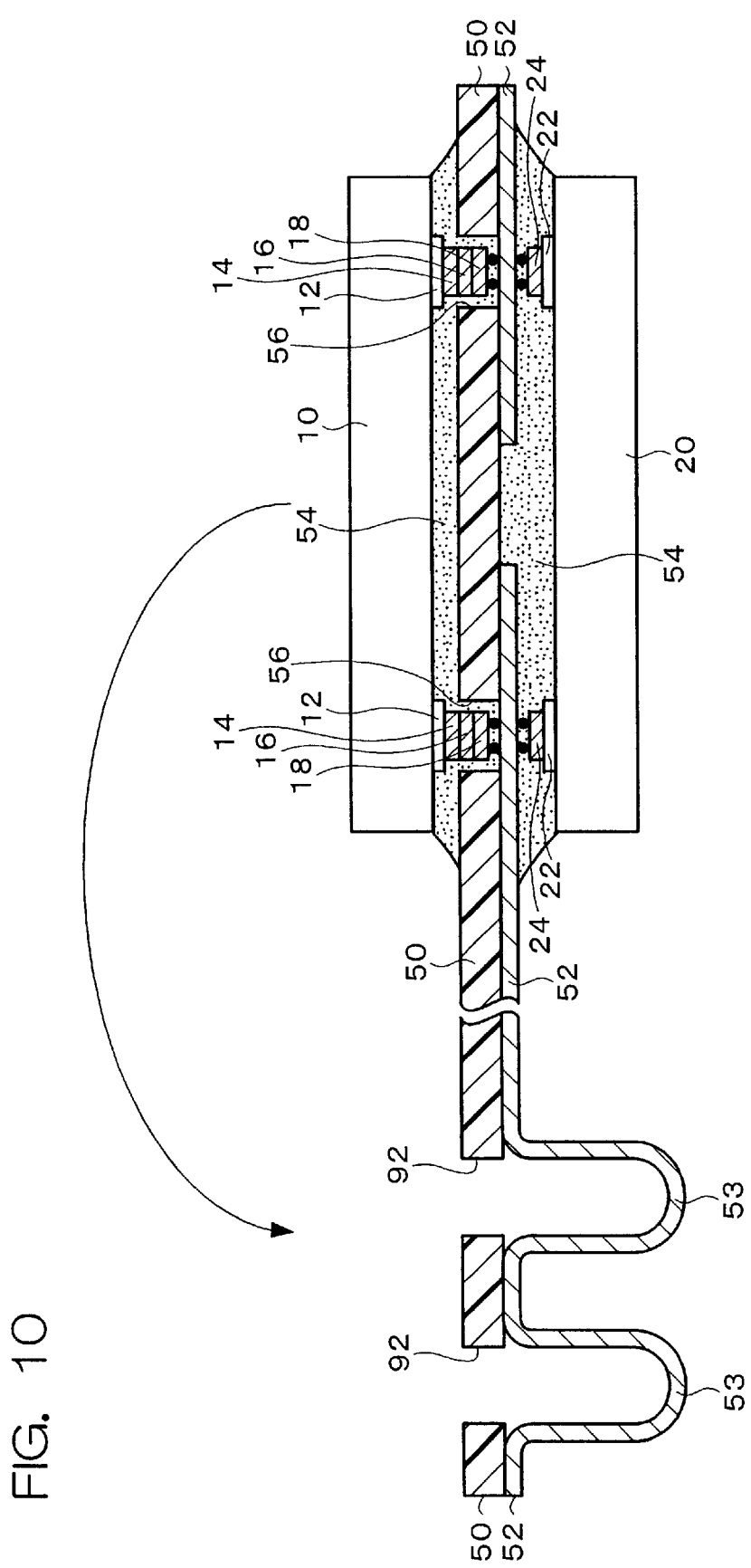
FIG. 10 is a view showing a semiconductor device according to a fourth embodiment to which the present invention is applied.

FIG. 10 is a view showing a semiconductor device according to the present embodiment. FIG. 10 is a view showing the semiconductor device before the bendable substrate 50 (flexible substrate) is bent. The semiconductor device according to the present embodiment includes the first and second semiconductor chips 10 and 20 and the substrate 50.

In the semiconductor device according to the present embodiment, the interconnecting pattern 52 has bending sections 53. The configuration of the bending sections 53 is not limited. The bending sections 53 may project to the surface of the substrate 50. The through-holes 92 may be formed in the substrate 50 in the region corresponding to the bending sections 53. This allows the convex-shaped bending sections 53 to be formed by passing a convex-shaped jig through the through-holes 92. In FIG. 10, the bending sections 53 project in the same direction as the direction in which the substrate 50 faces the interconnecting patterns 52. The bending sections 53 may project through the through-holes 92 to the surface of the substrate 50 opposite to the surface on which the interconnecting patterns 52 are formed. A semiconductor device having the same function as the external terminals 90 can be obtained by forming the bending sections 53. Since the semiconductor device according to the present embodiment includes the bending sections 53 of the interconnecting patterns 52 having the same function as the external terminals 90 in place of the external terminals 90, the semiconductor device can be applied to all embodiments having the external terminals 90.

It is preferable that the interconnecting patterns 52 be covered with a resist or the like in the area excluding the bending sections 53.

The bending sections 53 may be filled with a soft resin. The step and cost for forming the external terminals can be reduced by using the bending sections 53 as the external terminals in this manner. Moreover, since copper foil or the like harder than solder, etc. can be used as the external terminals, temperature cycle reliability after mounting the semiconductor device on the motherboard can be further improved.

Fifth Embodiment

Figure 11:
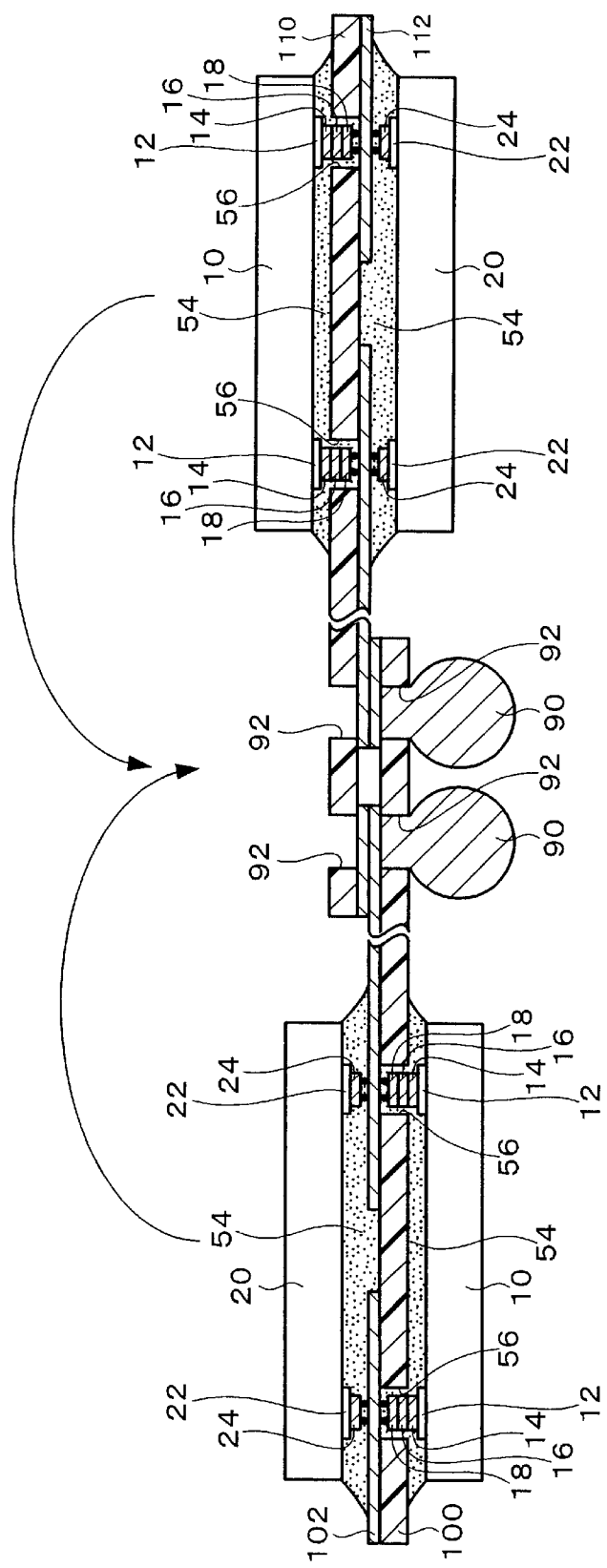
FIG. 11 is a view showing a semiconductor device according to a fifth embodiment to which the present invention is applied.
Figure 12:
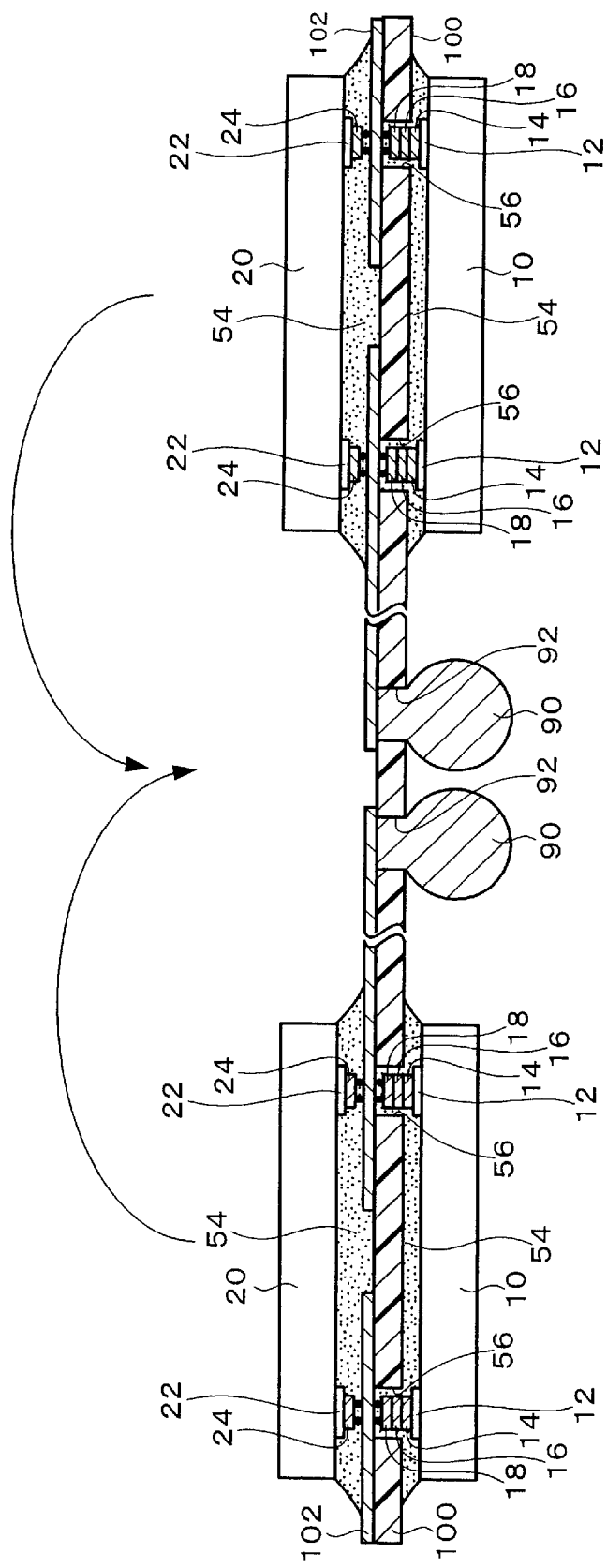
FIG. 12 is a view showing the semiconductor device according to the fifth embodiment to which the present invention is applied.

FIGS. 11 and 12 are views showing a semiconductor device according to the present embodiment. FIGS. 11 and 12 are views showing the semiconductor device in which substrates 100 and 110 are straight in one plane.

In the semiconductor device according to the present embodiment, part of the substrate having a mounting region of at least either the first semiconductor chip 10 or the second semiconductor chip 20 extends from the region for the external terminals in several directions (two, three, or four directions 90). A semiconductor device with a stacked structure is manufactured by superposing part of the substrate extending in several directions on a plane in the region for the external terminals 90.

In the example shown in FIG. 11, a plurality of bendable substrates 100 and 110 (conventional flexible substrates, for example) are connected in part. The semiconductor device shown in FIG. 11 includes a plurality of substrates 100 and 110 and a plurality of first and second semiconductor chips 10 and 20. The semiconductor device may be a combination of the semiconductor devices shown in FIG. 7. The first and second semiconductor chips 10 and 20 are mounted in one end section of the substrates 100 and 110. A region for forming the external terminals 90 (including the region for connecting each interconnecting pattern) is formed in the other end section. These other end sections are superposed on a plane. In the example shown in FIG. 11, the substrates 100 and 110 are superposed in part. Note that three or four substrates may be superposed one on top of the other. The substrates 100 and 110 may have the same structure as the substrate 50.

Part of the interconnecting patterns 102 and 112 formed on each substrate may be directly connected so as to. face each other. The external terminals 90 formed on the interconnecting pattern 102 are electrically connected to the interconnecting pattern 112. Each interconnecting pattern 102 and 112 is easily connected by applying ultrasonic vibration or heat and pressure, although the method is not limited. The external terminals 90 may be formed on either interconnecting pattern in the region in which part of a pair of the interconnecting patterns 102 and 112 is connected each other, for example. Specifically, configuration of the connection between the substrates and formation of the external terminals 90 are not limited insofar as a plurality of semiconductor chips formed on a plurality of substrates can be controlled using the same external terminal arrangement.

The interconnecting pattern 52 having the bending sections 53 in part in place of the external terminals 90 may be used. In this case, the interconnecting patterns 102 and 112 facing each other may be bent while being connected in the direction in which it is desired to allow the bending sections 53 of the interconnecting pattern to project, thereby allowing the interconnecting patterns 102 and 112 to project as the external terminals.

A plurality of substrates is used and the arrangement of the substrates 100 and 110 to be connected is not limited. At least one pair of the first and second semiconductor chips 10 and 20 is used. For example, the first and second semiconductor chips 10 and 20 may be mounted on either substrate, and only either the first semiconductor chip 10 or and the second semiconductor chip 20 may be mounted on the other substrate.

Differing from the above-described example, part of the substrate 100 may extend from the region for the external terminals 90 in several directions, as shown in FIG. 12. For example, the substrate 100 has the region for the external terminals 90, and part of the substrate 100 extends in at least two directions among four vertical and lateral directions. The extending portions of the substrate 100 are superposed on a plane in the region for the external terminals 90. This enables the thickness of the region for the external terminals 90 before bent to be as thin as one substrate, miniaturization of the semiconductor device and reduction of the weight can be achieved.

Figure 13:
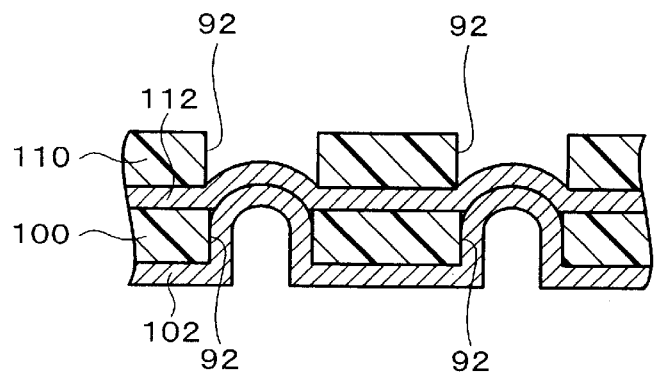
FIG. 13 is a view showing a semiconductor device according to a modification example of the fifth embodiment to which the present invention is applied.

FIG. 13 is a view showing a modification example of the connection configuration of each interconnecting pattern in the case of connecting a plurality of substrates. FIG. 13 is a view showing part of the semiconductor device in which the connection sections between each. interconnecting pattern is illustrated. In this modification example of the present embodiment, the semiconductor device includes a plurality of substrates 100 and 110. The substrates 100 and 110 are connected so that the surface of the substrate 100 on which the interconnecting pattern 102 is formed and the surface of the substrate 110 on which the interconnect patter 102 is formed to face in the same direction.

The interconnecting patterns 102 and 112 may be connected through a plurality of through-holes 92 formed in at least one substrate. Specifically, the interconnecting patterns may be connected by bending either interconnecting pattern toward the other in the through-holes 92. In this case, either interconnecting pattern may be bent along the bending shape of the other interconnecting pattern. The interconnecting pattern is easily connected by applying ultrasonic vibration or heat and pressure, although the method is not particularly limited. The interconnecting patterns 102 and 112 connected in the through-holes 92 may project as the external terminals through the opening of the through-holes formed in the substrate located outermost. In this case, the interconnecting patterns may not be bent if the electrical connection is established by filling the through-holes 92 with a brazing material such as solder, conductive paste. The through-holes 92 may be formed through the substrates 100 and 110 in the region in which the substrates 100 and 110 are overlapping each other. The through-holes 92 maybe formed in at least one substrate insofar as each interconnecting pattern can be connected. A plurality of substrates is used, and the arrangement of each substrate to be connected is not limited.

According to the present embodiment, a substrate formed by connecting a plurality of substrates 100 and 110 may be used. This enables a greater number of semiconductor chips to be mounted. Because of this, a multichip module excelling in productivity can be developed.

Sixth Embodiment

Figure 14:
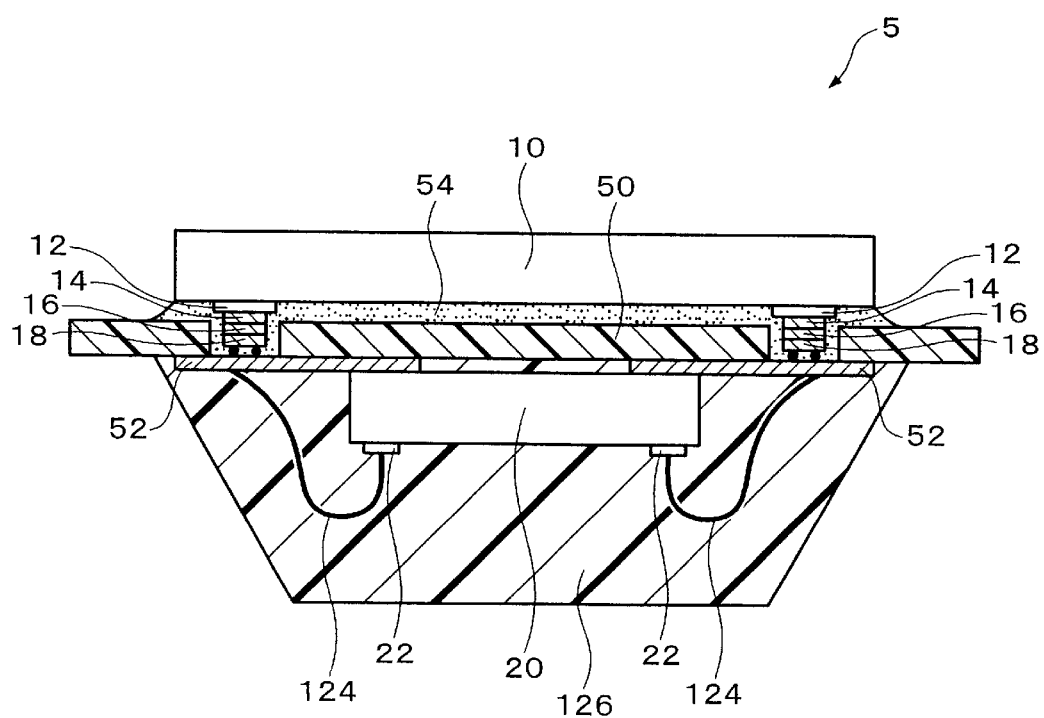
FIG. 14 is a view showing a semiconductor device according to a sixth embodiment to which the present invention is applied.

FIG. 14 is a view showing a semiconductor device according to the present embodiment. A semiconductor device 5 shown in FIG. 14 includes the first semiconductor chip 10, the second semiconductor chip 20, and the substrate 50.

In the present embodiment, either the first semiconductor chip 10 or second semiconductor chip 20 is bonded face down and the other is mounted by wire bonding. In FIG. 14, the electrodes 22 of the second semiconductor chip 20 are wire bonded to the interconnecting patterns 52. In the present embodiment, a plurality of first semiconductor chips 10 and a plurality of second semiconductor chips 20 may be used. For example, one of the semiconductor chips may be bonded face down and one of the semiconductor chips may be connected by wire bonding on only one surface of the substrate 50.

The first semiconductor chip 10 and the substrate 50 are the same as described above. In FIG. 14, a plurality of electrodes 22 of the second semiconductor chip 20 is electrically connected to the interconnecting patterns 52 through wires 124. The wires 124 may be the above conductive lines 30. The electrodes 22 are connected to the interconnecting patterns 52 by connecting one of the electrodes 22 to one of the interconnecting patterns 52 in the same manner as described above. The connection sections between the wires 124 and the interconnecting patterns 52 may be part of the interconnecting patterns 52 (land sections) over the holes 56. In the case of wire bonding the interconnecting patterns 52 on the surface of the second semiconductor chip 20, the wires 124 may be connected to the interconnecting patterns 52 so as to avoid the holes 56.

The second semiconductor chip 20 may be bonded face down and the electrodes of the first semiconductor chip 10 may be connected by wire bonding. Specifically, the wires may be connected to part of the interconnecting patterns 52 (land sections) exposed by the holes 56.

According to the present embodiment, the first and second semiconductor chips 10 and 20 can be mounted on both surfaces of the substrate 50 with the interconnecting patterns 52 formed on one surface. Therefore, cost and the number of the mounting steps can be reduced in comparison with a substrate with the interconnecting patterns formed on both surfaces. Moreover, the weight of the semiconductor device can be reduced. Because of this, a multichip module excelling in productivity can be developed.

The semiconductor chip 20 to which wire bonding is applied is generally sealed with a resin 126. The semiconductor chip 20 can be protected from the external environment by the resin 126. It is preferable to perform the wire bonding step after bonding the second semiconductor chip 20 to the substrate 50 using a die bonding material (not shown; see FIG. 15).

Figure 15:
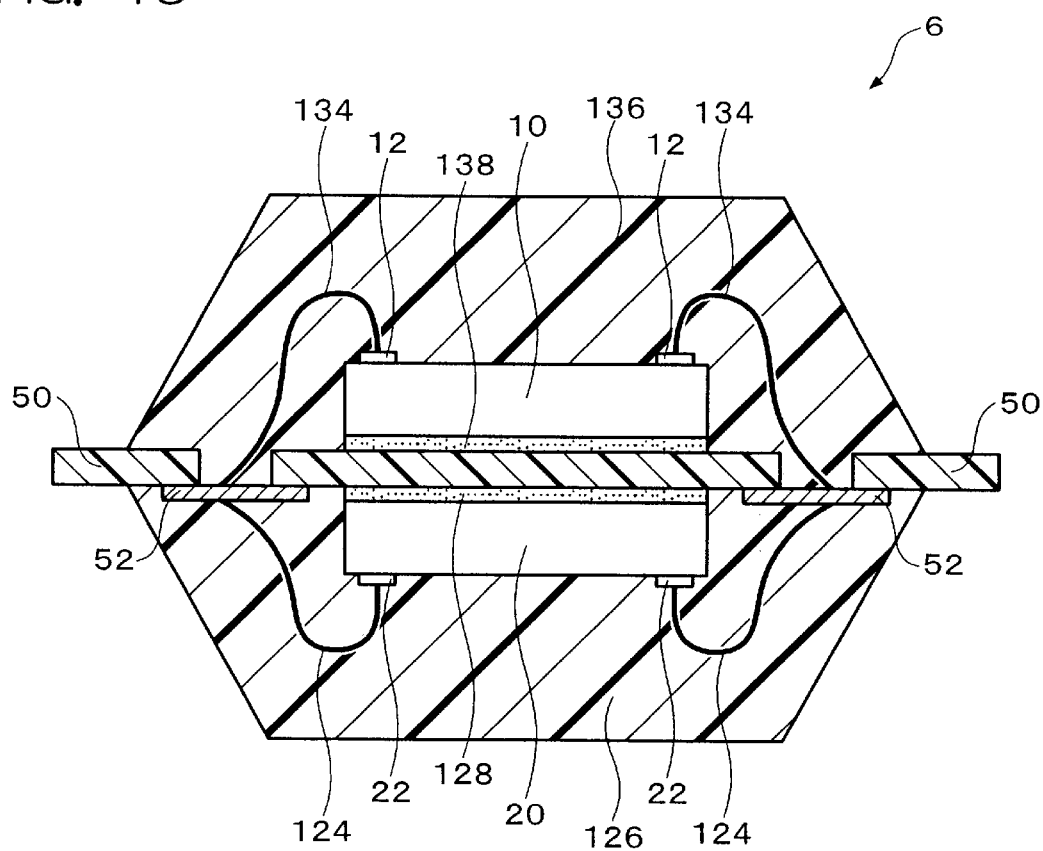
FIG. 15 is a view showing a semiconductor device according to a modification example of the sixth embodiment to which the present invention is applied.

FIG. 15 is a view showing a semiconductor device according to a modification example of the present embodiment. A semiconductor device 6 includes the first and second semiconductor chips 10 and 20 and the substrate 50.

In FIG. 15, both of the first and second semiconductor chips 10 and 20 are electrically connected by wire bonding. Wires 134 connected to the electrodes of the first semiconductor chip 10 are connected to part of the interconnecting patterns 52 (land sections) exposed by the holes 56. Specifically, the wires 134 may be used as the above-described conductive members in FIG. 15. The first and second semiconductor chips 10 and 20 may differ in size. The connection sections of the wires 124 and 134 with the interconnecting patterns 52 may be superposed on a plane or not.

As the method of manufacturing the semiconductor device 6, the semiconductor chip mounted on one surface may be wire bonded and sealed with a resin, and the semiconductor chip mounted on the other surface may be treated in the same manner thereafter. This enables the semiconductor device to be manufactured using existing manufacturing device.

In FIGS. 14 and 15, external terminals (not shown) may be further formed. The external terminals may have the above-described configuration and structure or those described below. For example, the external terminals electrical conducting with the interconnecting patterns 52 may project to either surface of the substrate 50 so as to avoid the mounting region of the semiconductor chip. In the case of forming the external terminals, terminals electrically conducting with the interconnecting patterns 52 are exposed at the surface.

In the above embodiments, the semiconductor device including the interconnecting patterns 52 having the external terminals 90 or bending sections 53 in part is described. Part of the substrate 50 may extend and the external connection may be established therefrom. Part of the substrate 50 may be used as leads for connectors, or connectors may be mounted on the substrate 50.

Instead of positively forming the external terminals 90, the external terminals may be formed when mounting the semiconductor device on a motherboard using solder cream applied to the motherboard due to surface tension during melting. Such a semiconductor device is referred to as a land grid array semiconductor device.

The description given in the above embodiment is applied to other embodiments as far as possible.

Figure 16:
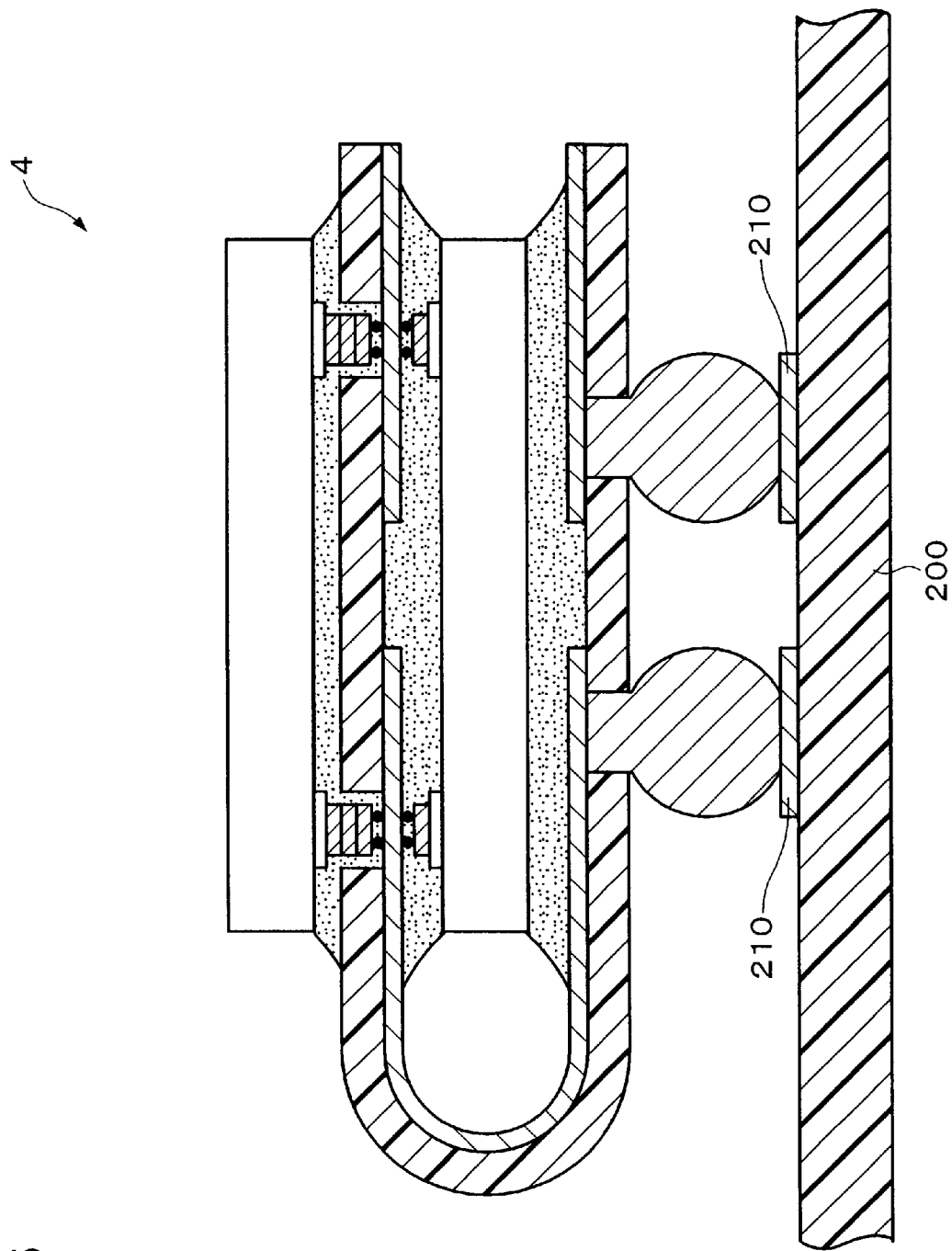
FIG. 16 is a view showing a circuit board to which the present invention is applied.

FIG. 16 is a view showing a circuit board 200 on which the semiconductor device 4 according to the present embodiment is mounted. An organic substrate such as a glass epoxy substrate is generally used as the circuit board 200. Interconnecting patterns 210 are formed on the circuit board 200 using copper, for example, so as to form a desired circuit. Electrical conduction between the interconnecting patterns and the semiconductor device 4 is established by mechanically connecting the interconnecting patterns to the external terminals 90 of the semiconductor device 4.

Figure 17:
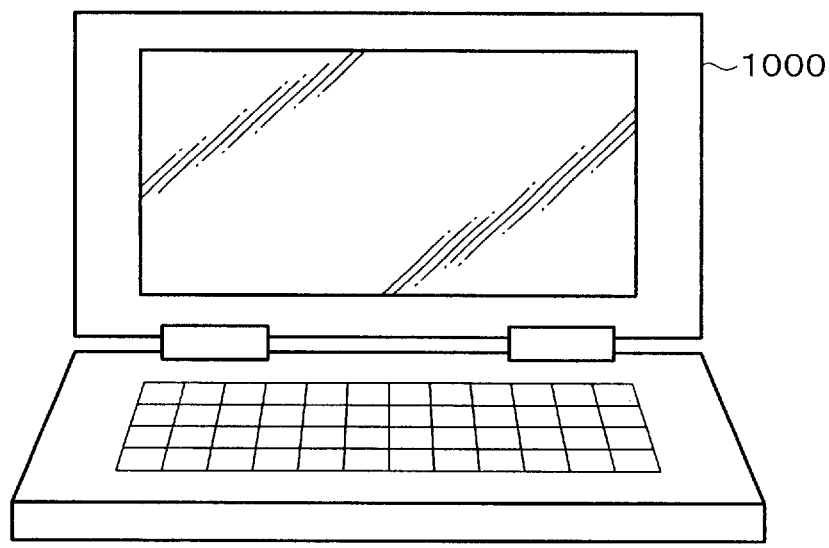
FIG. 17 is a view showing electronic equipment equipped with the semiconductor device according to the present invention.
Figure 18:
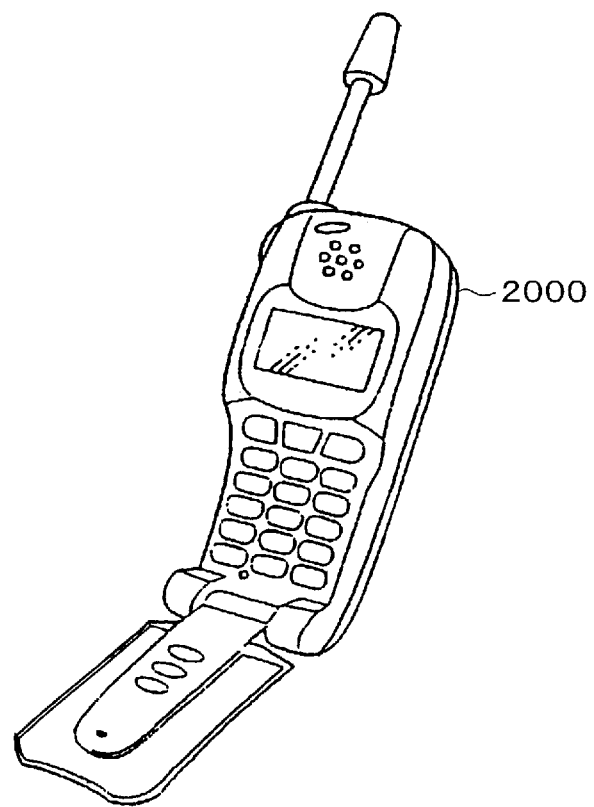
FIG. 18 is a view showing electronic equipment equipped with the semiconductor device according to the present invention.

FIGS. 17 and 18 respectively show a notebook-type personal computer 1000 and a portable telephone 2000 as examples of electronic equipment including the semiconductor device to which the present invention is applied.

Among the constituents of the present invention, a "semiconductor chip" maybe replaced by an "electronic device". Electronic parts may be manufactured by mounting electronic devices (may be either active devices or passive devices) on a substrate in the same manner as in the case of the semiconductor chip. As examples of the electronic parts manufactured by using such electronic devices, optical devices, resistors, capacitors, coils, oscillators, filters, thermosensors, thermistors, varistors, variable resistors, fuses, and the like can be given.

All of the embodiments described above may be a semiconductor device in which semiconductor chips and other electronic devices as illustrated above are mounted on a substrate in combination (mounting module).

What is claimed is:

1. A semiconductor device comprising:
   at least one substrate including a plurality of holes formed therein and an interconnecting pattern provided to one surface of the substrate, part of the interconnecting pattern being formed so as to overlap with the holes,
   at least one first semiconductor chip including a plurality of electrodes and provided to another surface of the substrate,
   at least one second semiconductor chip including a plurality of electrodes and provided to the one surface of the substrate, and
   a conductive member disposed in each of the holes for electrically connecting each of the electrodes of the first semiconductor chip to the interconnecting pattern.

2. The semiconductor device as defined in claim 1,
   wherein the first semiconductor chip and the second semiconductor chip have sections overlapping each other in plane view.

3. The semiconductor device as defined in claim 1,
   wherein the electrodes of at least one of the first semiconductor chip and the second semiconductor chip are connected to the interconnecting pattern by wire bonding.

4. The semiconductor device as defined in claim 1,
   wherein at least one of the first semiconductor chip and the second semiconductor chip is mounted face down.

5. The semiconductor device as defined in claim 1,
   wherein the first semiconductor chip and the second semiconductor chip are mounted face down, and
   wherein the electrodes of the first semiconductor chip are disposed to face the holes.

6. A circuit board provided with the semiconductor device as defined in claim 1.

7. Electronic equipment having the semiconductor device as defined in claim 1.

8. The semiconductor device as defined in claim 5,
   wherein a resin is provided between the substrate and the first semiconductor chip.

9. The semiconductor device as defined in claim 5,
   wherein a resin is provided between the substrate and the second semiconductor chip.

10. The semiconductor device as defined in claim 5,
    wherein a plurality of the substrates are provided, and part of the interconnecting patterns of a pair of the substrates are disposed facing each other for electrical connection between the interconnecting patterns.

11. The semiconductor device as defined in claim 5,
    wherein the substrate is bent.

12. The semiconductor device as defined in claim 5,
    wherein the conductive member is a plurality of layered bumps.

13. The semiconductor device as defined in claim 5,
    wherein the first semiconductor chip and the second semiconductor chip have the same outer shape.

14. The semiconductor device as defined in claim 5,
    wherein the electrodes of the second semiconductor chip are connected to the interconnecting pattern over the holes.

15. The semiconductor device as defined in claim 5, wherein the electrodes of the second semiconductor chip are connected to the interconnecting pattern at a position avoiding the holes.

16. The semiconductor device as defined in claim 8, wherein the resin is an anisotropic conductive material including conductive particles.

17. The semiconductor device as defined in claim 11, wherein a plurality of at least one of the first semiconductor chips and the second semiconductor chips are provided, and wherein the plurality of at least one of the first semiconductor chips and the second semiconductor chips are stacked.

18. The semiconductor device as defined in claim 13, wherein the second semiconductor chip has a mirror-symmetrical circuit structure with the first semiconductor chip.

19. The semiconductor device as defined in claim 11, wherein a plurality of external terminals electrically connected to the first and second semiconductor chips are formed on the substrate in a region other than a region in which the first and second semiconductor chips are formed.

20. The semiconductor device as defined in claim 10, wherein a plurality of external terminals are formed over the interconnecting patterns avoiding a region in which at least one of the first semiconductor chip and the second semiconductor chip is formed.

21. The semiconductor device as defined in claim 20, wherein the external terminals are formed on one of the pair of interconnecting patterns in a region in which part of the interconnecting patterns are connected to each other.

22. The semiconductor device as defined in claim 19, wherein a plurality of through-holes are formed in the substrate, wherein part of the interconnecting pattern runs over the through-holes, and wherein the external terminals project through the through-holes to a surface of the substrate to which the first semiconductor chip is provided.

23. A method of manufacturing a semiconductor device comprising:

a step of mounting a first semiconductor chip over one surface of a substrate which includes a plurality of holes and an interconnecting pattern formed over another surface, part of the interconnecting pattern running over the holes; and a step of positioning a second semiconductor chip on the other surface of the substrate over which the interconnecting pattern is formed, wherein, in the step of mounting the first semiconductor chip, electrodes of the first semiconductor chip are electrically connected to the interconnecting pattern through a conductive member provided in each of the holes by disposing the electrodes of the first semiconductor chip to face the holes.

24. The method of manufacturing a semiconductor device as defined in claim 23, wherein the conductive member is at least one bump, and wherein the method further comprises a step of providing the bump to each of the electrodes of the first semiconductor chip in advance.

25. The method of manufacturing a semiconductor device as defined in claim 23, further comprising:

a step of providing a resin to the substrate in a region in which the first semiconductor chip is positioned.

26. The method of manufacturing a semiconductor device as defined in claim 23, wherein the second semiconductor chip has a mirror-symmetrical circuit structure with the first semiconductor chip.

27. The method of manufacturing a semiconductor device as defined in claim 23, wherein the electrodes of the second semiconductor chip are connected to the interconnecting pattern over the holes.

28. The method of manufacturing a semiconductor device as defined in claim 23, wherein the electrodes of the second semiconductor chip are connected to the interconnecting pattern at a position avoiding the holes.

29. The method of manufacturing a semiconductor device as defined in claim 25, further comprising:

a step of providing a resin to the substrate in a region in which the second semiconductor chip is positioned.

30. The method of manufacturing a semiconductor device as defined in claim 29, wherein a step of providing a resin between the substrate and the first semiconductor chip and a step of providing a resin between the substrate and the second semiconductor chip are carried out at the same time.

31. The method of manufacturing a semiconductor device as defined in claim 25, further comprising:

after the step of providing the resin, a step of providing the first and second semiconductor chips to the substrate and applying pressure and heat to surfaces of the first and second semiconductor chips opposite to surfaces facing the substrate.

32. A manufacturing device for a semiconductor device comprising:

first and second jigs each of which is disposed leaving a space from a surface of each of a plurality of semiconductor chips opposite to a surface facing a substrate, the semiconductor chips being mounted over both surfaces of the substrate through a resin, wherein each of the first and second jigs comprises a surface for applying pressure to a surface of each of the semiconductor chips opposite to the surface facing a substrate and a heating means for transmitting heat to each of the semiconductor chips, and the first and second jigs apply pressure and heat to the respective semiconductor chips positioned between the first and second jigs at the same time to make adhesive force of resin on the substrate effective so that the semiconductor chips are mounted over the substrate.

* * * * *